United States Patent
Moon et al.

(10) Patent No.: US 9,136,376 B2
(45) Date of Patent: Sep. 15, 2015

(54) SEMICONDUCTOR DEVICE HAVING JUNCTIONLESS VERTICAL GATE TRANSISTOR AND METHOD OF MANUFACTURING THE SAME

(71) Applicants: SK hynix Inc., Icheon-si (KR); Korea Advanced Institute of Science and Technology, Daejeon (KR)

(72) Inventors: Jung-Min Moon, Seoul (KR); Tae-Kyun Kim, Daejeon (KR); Seok-Hee Lee, Daejeon (KR)

(73) Assignees: SK HYNIX INC., Icheon (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 13/759,395

(22) Filed: Feb. 5, 2013

(65) Prior Publication Data

US 2013/0234240 A1  Sep. 12, 2013

(30) Foreign Application Priority Data

Mar. 12, 2012  (KR) .......... 10-2012-0024991

(51) Int. Cl.
*H01L 29/66* (2006.01)
*H01L 29/78* (2006.01)
*H01L 29/423* (2006.01)

(52) U.S. Cl.
CPC ...... *H01L 29/7827* (2013.01); *H01L 29/66666* (2013.01); *H01L 29/7828* (2013.01); *H01L 29/4236* (2013.01); *H01L 29/42376* (2013.01)

(58) Field of Classification Search
CPC ........... H01L 29/66795; H01L 29/785; H01L 27/10826; H01L 27/10829; H01L 27/11556; H01L 29/66; H01L 29/7829; H01L 29/4236; H01L 29/7827; H01L 29/66666; H01L 29/7828
USPC ........................ 257/306–348; 438/149–212
See application file for complete search history.

(56) References Cited

U.S. PATENT DOCUMENTS

| | | | |
|---|---|---|---|
| 2003/0178670 A1* | 9/2003 | Fried et al. .................... | 257/315 |
| 2008/0128796 A1* | 6/2008 | Zhu et al. ...................... | 257/328 |
| 2012/0001255 A1* | 1/2012 | Park .............................. | 257/329 |
| 2012/0056255 A1* | 3/2012 | Sukekawa ..................... | 257/296 |
| 2012/0112270 A1* | 5/2012 | Park et al. ..................... | 257/330 |
| 2012/0119278 A1* | 5/2012 | Mikasa .......................... | 257/306 |
| 2012/0119286 A1* | 5/2012 | Kim et al. ...................... | 257/329 |

FOREIGN PATENT DOCUMENTS

KR  10-0784930 B1  12/2007

* cited by examiner

*Primary Examiner* — Eugene Lee
*Assistant Examiner* — Fang-Xing Jiang

(57) ABSTRACT

A junctionless vertical gate transistor includes an active pillar vertically protruding from a substrate and including a first impurity region, a second impurity region and a third impurity region sequentially formed over the first impurity region; gate electrodes coupled to sidewalls of the second impurity region; and bit lines arranged in a direction of intersecting with the gate electrodes and each contacting the first impurity region. The first to the third impurity regions include impurities of the same polarity.

18 Claims, 39 Drawing Sheets

SEMICONDUCTOR DEVICE HAVING JUNCTIONLESS VERTICAL GATE TRANSISTOR AND METHOD OF MANUFACTURING THE SAME

CROSS-REFERENCE TO RELATED APPLICATION

This application claims the benefit under 35 U.S.C. §119 of Korean Patent Application No. 10-2012-0024991, filed on Mar. 12, 2012 in the Korean Intellectual Property Office, the entirety of which disclosure is incorporated herein by reference.

BACKGROUND

1. Technical Field

The present invention relates to semiconductor devices, and more particularly, to a semiconductor device having a junctionless vertical gate transistor and a method of manufacturing the same.

2. Description of the Related Art

The design rule margin has been decreased with an increase in the degree of integration of semiconductor devices. Such decrease in design rule margin results in limitations on the technical development of high density semiconductor devices.

In recent years, studies have been focused on development of a $4F^2$ layout (F; minimum pattern size obtainable under a given process condition), which permit formation of cells with a remarkably higher density. Particularly, vertical channel transistors where a source and a drain are formed in $1F^2$ have been studied.

However, as a channel region is reduced to 30 nm or less, it becomes more difficult to improve the degree of integration due to a process difficulty and an increase in leakage current resulting from a size reduction of semiconductor devices.

For example, Korean Patent No. 0784930, herein incorporated by reference, discloses a memory cell having a vertical channel double gate structure, which has an active region of an NPN junction structure.

BRIEF SUMMARY

The present invention provides a semiconductor device that can solve the problem of current leakage caused by implanting different kinds of impurities into source, drain and body regions.

In addition, the present invention provides a method of manufacturing a semiconductor device that can solve complexity and difficulty of impurity implantation.

In accordance with one aspect of the present invention, a semiconductor device includes: an active pillar vertically protruding from a substrate and including a first impurity region, a second impurity region and a third impurity region from a lower side thereof; gate electrodes formed on sidewalls of the second impurity region; and bit lines arranged in a direction of intersecting with the gate electrodes and each contacting the first impurity region, wherein the first to third impurity regions include impurities of the same conductivity.

In accordance with another aspect of the present invention, a method of manufacturing a semiconductor device includes forming a plurality of active pillars, each having a first impurity region formed on a substrate and second and third impurity regions sequentially formed on the first impurity region; forming a bit line between adjacent active pillars on the substrate to be electrically disconnected from the substrate while contacting one side surface of the first impurity region; and forming gate electrodes on sidewalls of the second impurity region in a direction of intersecting with the bit line.

In accordance with a further aspect of the present invention, a method of manufacturing a semiconductor device includes forming a plurality of bit lines embedded within a substrate; forming active pillars on the bit lines, each of the active pillars including a first impurity region contacting the bit line and second and third impurity regions sequentially formed on the first impurity region; and forming gate electrodes on sidewalls of the second impurity region in a direction of intersecting with the bit lines.

According to the present invention, the semiconductor device employs a junctionless vertical gate transistor, which is formed by implantation of an impurity into source, drain and body regions in the same concentration and is free from junction current leakage, thereby providing excellent electrical properties and reliability and enabling high integration of devices through formation of a cell structure of $4F^2$.

In addition, since the semiconductor device according to the present invention has no difference in doping concentration between the source and the body and between the drain and the body, the intensity of electrical field becomes weaker in junctions between the source and the body and between the drain and the body than in the case of using the existing junction transistors, so that the semiconductor device is less affected by impact ionization or gate induced drain leakage (GIDL).

Further, according to the present invention, the semiconductor device employs the junctionless vertical gate transistor and thus does not suffer from a floating body effect, which causes an increase in voltage of the body due to holes generated during operation of the device, despite the absence of body contact.

According to the present invention, the method of manufacturing a semiconductor device may solve complexity and difficulty of impurity implantation by implanting the same kind of impurity into source, drain and body regions, thereby improving productivity and yield.

BRIEF DESCRIPTION OF THE DRAWINGS

The above and other aspects, features, and advantages of the invention will become apparent from the detailed description of the following embodiments in conjunction with the accompanying drawings, in which.

DETAILED DESCRIPTION

Figure 1:
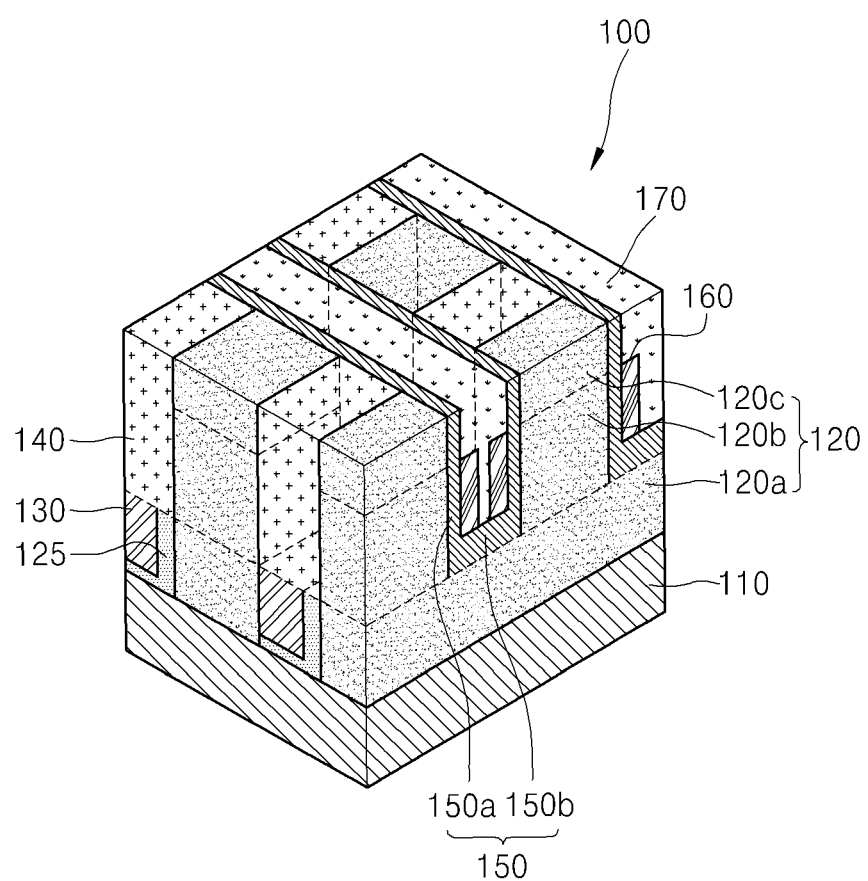
FIG. 1 is a perspective view of part of a semiconductor device having a junctionless vertical gate transistor in accordance with a first embodiment of the present invention.

Embodiments of the invention will now be described in detail with reference to the accompanying drawings. It should be understood that the present invention is not limited to the following embodiments and may be embodied in different ways, and that the embodiments are given to provide complete disclosure of the invention and to provide thorough understanding of the invention to those skilled in the art. The scope of the invention is limited only by the accompanying claims and equivalents thereof. Like components will be denoted by like reference numerals throughout the specification.

Figure 2:
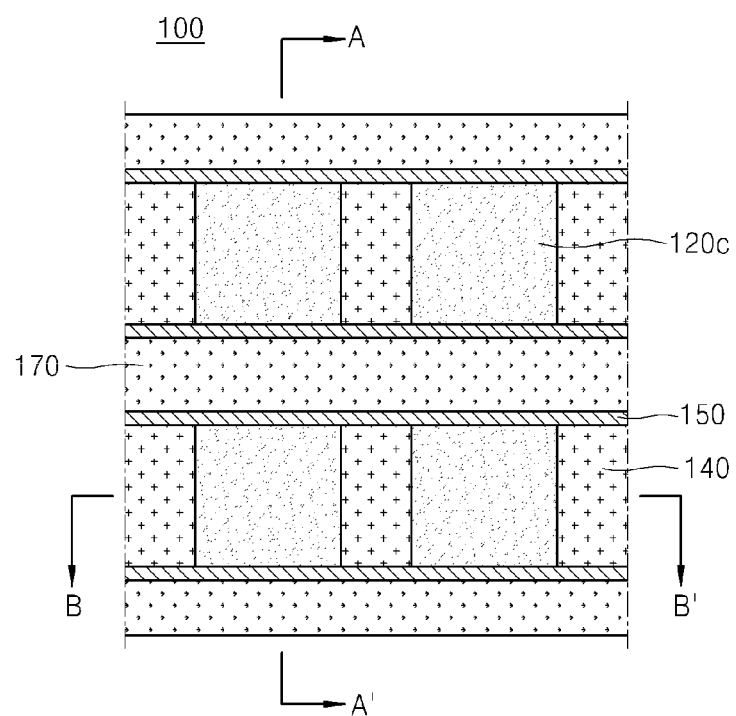
FIG. 2 is a plan view of the semiconductor device of FIG. 1.
Figure 3:
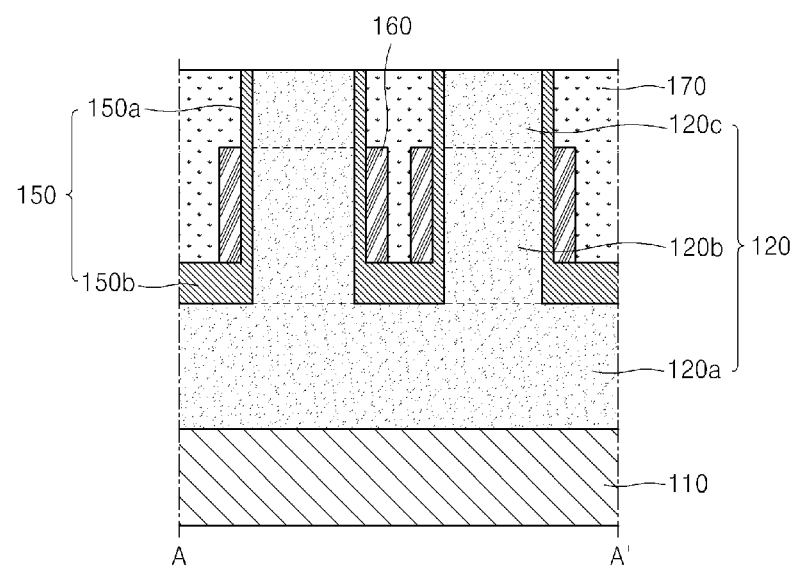
FIG. 3 is a cross-sectional view taken along the line A-A' of FIG. 2.
Figure 4:
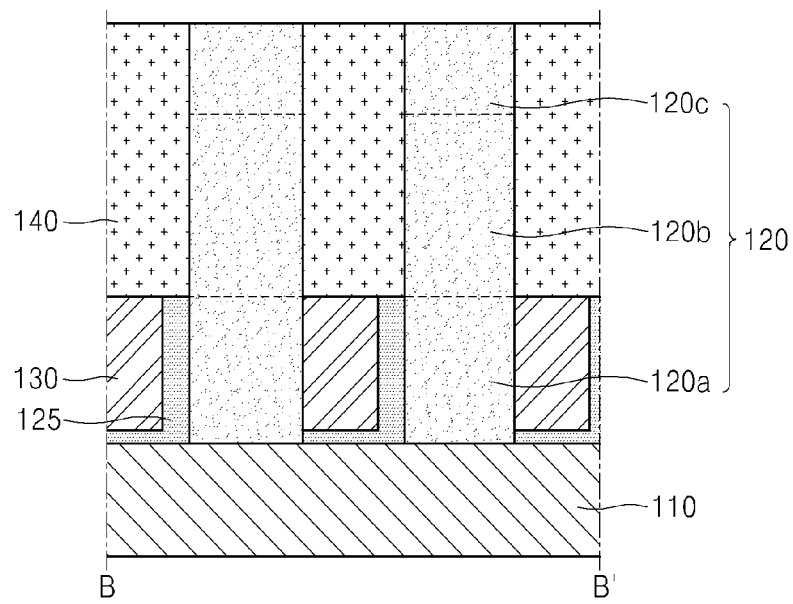
FIG. 4 is a cross-sectional view taken along the line B-B' of FIG. 2.
Figure 7:
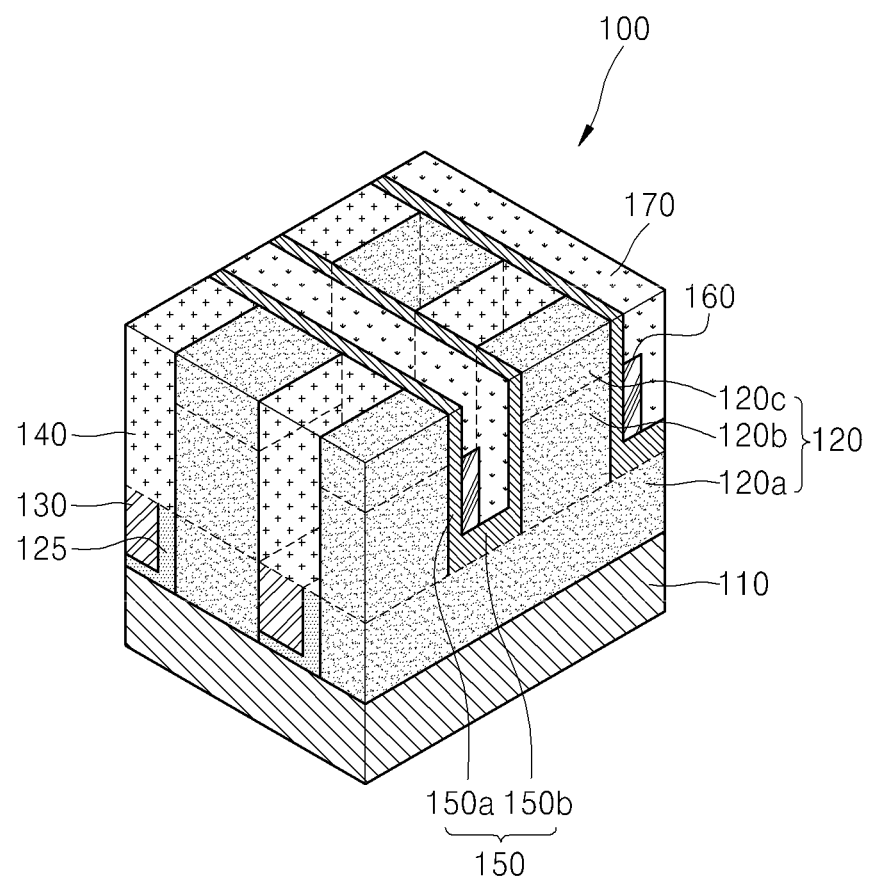
FIG. 7 is a perspective view of part of a semiconductor device having a junctionless vertical gate transistor in accordance with a second embodiment of the present invention.
Figure 11:
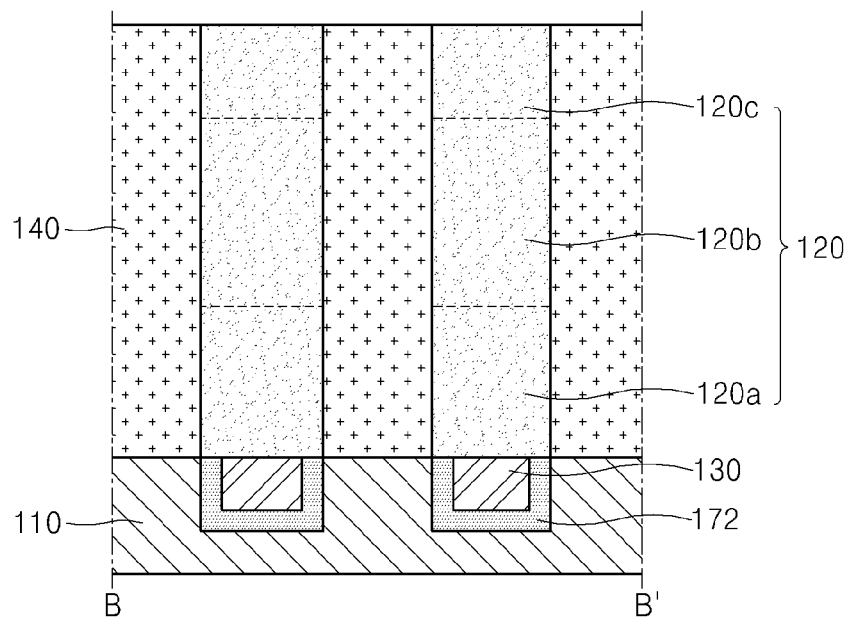
FIG. 11 is a sectional view of part of a semiconductor device having a junctionless vertical gate transistor in accordance with a third embodiment of the present invention.
Figure 12:
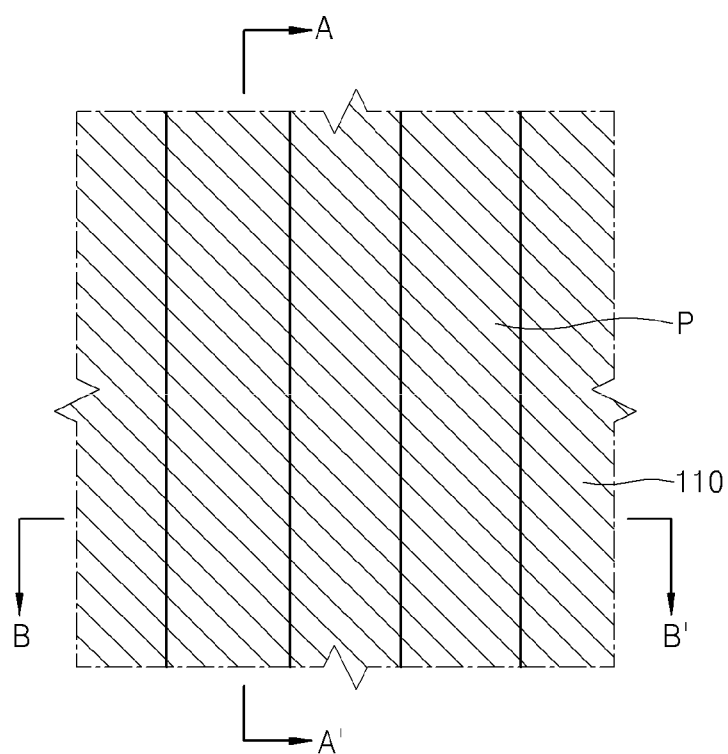
FIGS. 12, 15, 18, 21, 24, 27 and 30 are plan views of a method of manufacturing a semiconductor device in accordance with an embodiment of the present invention.
Figure 13:
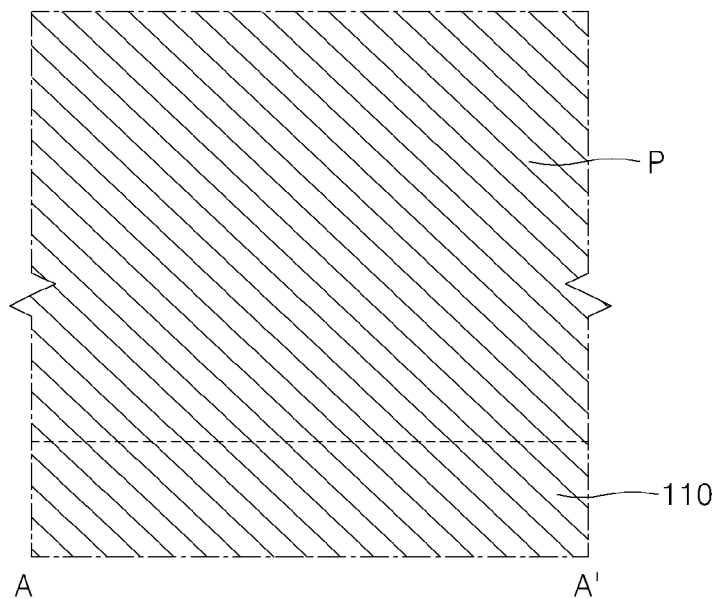
FIGS. 13, 16, 19, 22, 25, 28 and 31 are cross-sectional views taken along the lines A-A' of FIGS. 12, 15, 18, 21, 24, 27 and 30, respectively.

FIG. 1 is a perspective view of part of a semiconductor device having a junctionless vertical gate transistor in accordance with a first embodiment of the present invention; FIG. 2 is a plan view of the semiconductor device of FIG. 1; FIG. 3 is a cross-sectional view taken along the line A-A' of FIG. 2; FIG. 4 is a cross-sectional view taken along the line B-B' of FIG. 2; FIG. 7 is a perspective view of part of a semiconductor device having a junctionless vertical gate transistor in accordance with a second embodiment of the present invention; and FIG. 11 is a sectional view of part of a semiconductor device having a junctionless vertical gate transistor in accordance with a further embodiment of the present invention. By way of example, a dynamic random access memory (DRAM) is shown in the drawings.

Referring to FIG. 1 to FIG. 4, a semiconductor device 100 according to one embodiment of the present invention includes a plurality of active pillars 120, each of which vertically protrudes from a substrate 110 and includes a first impurity region 120a, a second impurity region 120b, and a third impurity region 120c formed from a lower side thereof. A pair of gate electrodes 160 is formed over first and second sidewalls of each of the second impurity regions 120b. Bit lines 130 are arranged in a cross direction to the gate electrodes 160 and are formed over a sidewall of the first impurity region 120a. The first, the second and the third impurity regions 120a, 120b, 120c include impurities of the same polarity and have substantially the same concentration.

First, referring to FIG. 1 to FIG. 4, a junctionless vertical gate transistor used for the semiconductor device 100 according to a first embodiment of the present invention will be described.

The junctionless vertical gate transistor according to an embodiment of the present invention includes (i) the plurality of active pillars 120, each of which vertically protrudes from the substrate 110 and includes the first, second, and third impurity regions 120a, 120b, 120c sequentially formed from a lower side thereof, and (ii) the gate electrodes 160 formed over the first and the second sidewalls of the second impurity region 120b.

The substrate 110 may be composed of a silicon (Si) substrate, a silicon germanium (SiGe) substrate, a germanium (Ge) substrate, a III-V group compound semiconductor substrate, and the like, and may include a nano structure such as nano wires or nano ribbons.

The active pillars 120 vertically protrude from a surface of the substrate 110 and are composed of, for example, silicon. The active pillars 120 may be integrally formed with the substrate 110. Alternatively, the active pillars 120 may be formed using a separate semiconductor substrate or a separate epitaxial semiconductor layer grown from the substrate 110. The active pillars 120 correspond to parts of the semiconductor device in which trenches (not shown) are not formed. The respective active pillars 120 are separated from each other by a first isolation layer 125, a second isolation layer 140, and a third isolation layer 170 formed in the trenches (not shown).

Each of the active pillars 120 includes the first impurity region 120a, the second impurity region 120b, and the third impurity region 120c, which are sequentially formed from a lower side of each of the active pillar 120. Here, the first impurity region 120a is separated by a predetermined distance from the third impurity region 120c over the substrate 110 in the vertical direction, and the second impurity region 120b is interposed between the first impurity region 120a and the third impurity region 120c.

In the present invention, the first impurity region 120a may correspond to a drain region through which electric charges flow to the bit line 130. The second impurity region 120b may correspond to a body region, or to a channel region through which signals pass between the drain region and a source region when the gate electrodes 160 are turned on or turned off. The third impurity region 120c may correspond to the source region which is electrically coupled to a storage node contact plug and a lower electrode of a capacitor.

The first, the second, and the third impurity regions 120a, 120b, 120c may include impurities of the same polarity and have substantially the same concentration. Here, the first, the second, and the third impurity regions 120a, 120b, 120c may have uniform doping profiles. In addition, a vertical channel is formed between the first impurity region 120a and the third impurity region 120c in a direction perpendicular to a surface of the substrate 110.

When the substrate 110 is a silicon substrate, the impurities may be N-type impurities. The N-type impurities may be V-group impurities such as arsenic (As), phosphorus (P), bismuth (Bi), antimony (Sb), and the like, which may be used alone or in combination of two or more thereof.

When the substrate 110 is a silicon germanium (SiGe) substrate, a germanium (Ge) substrate, or a III-V group compound semiconductor substrate, the impurities may be P-type impurities. The P-type impurities may be III-group impurities, such as aluminum (Al), boron (B), indium (In), gallium (Ga), and the like, which may be used alone or in combination of two or more thereof.

Figure 5:
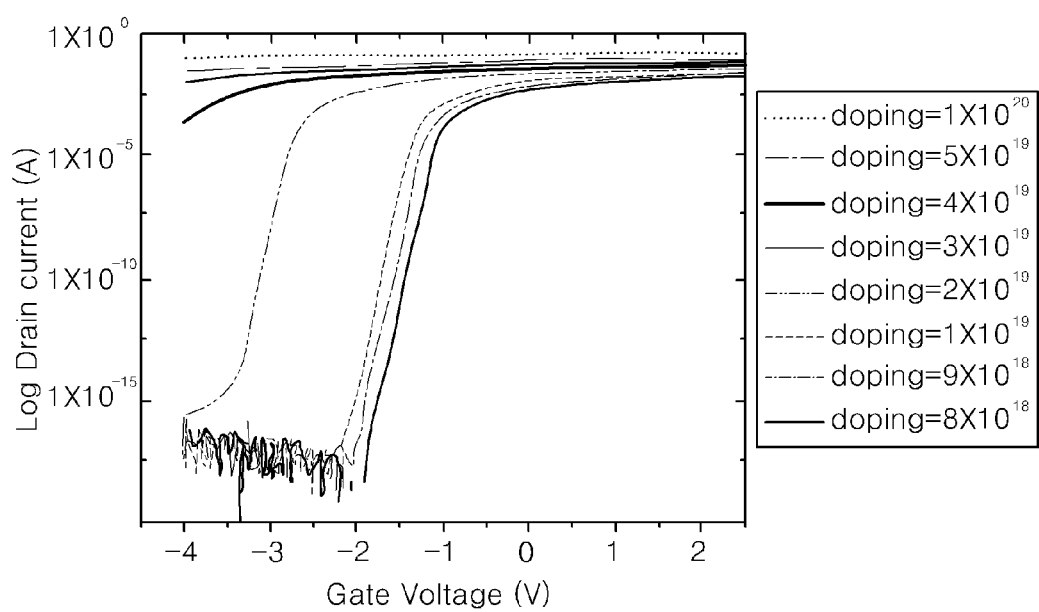
FIG. 5 is a graph depicting a relation between a gate-voltage and a drain-current depending on a doping concentration of impurities in an active region of a DRAM having a junctionless vertical gate transistor according to the first embodiment of the present invention.

FIG. 5 is a graph showing a relation between a gate-voltage and a drain-current depending on a doping concentration of impurities in an active pillar of a DRAM having the junctionless vertical gate transistor according to the first embodiment of the present invention.

In FIG. 5, to obtain a drain-current on/off ratio with respect to a gate-voltage, devices were used each of which employs dual-gate electrodes composed of molybdenum (Mo), and has work function of 5.25 eV. In each device, the active pillar 120 had a thickness (Tsi) of 10 nm, and a gate insulation layer 150 had a thickness (Tox) of 5 nm. The impurities were implanted into the active pillars 120 with doping concentrations of $1\times10^{20}$ atom/cm$^3$, $5\times10^{19}$ atom/cm$^3$, $4\times10^{19}$ atom/cm$^3$, $3\times10^{19}$ atom/cm$^3$, $2\times10^{19}$ atom/cm$^3$, $1\times10^{19}$ atom/cm$^3$, $9\times10^{18}$ atom/cm$^3$, and $8\times10^{18}$ atom/cm$^3$, respectively. Herein, the term "thickness (Tsi)" of the active pillar is defined as the thickness of a silicon pillar extending between two neighboring gate electrodes.

Referring to FIG. 5, the on/off ratio was high in impurity doping concentrations of $2\times10^{19}$ atom/cm$^3$, $1\times10^{19}$ atom/cm$^3$, $9\times10^{18}$ atom/cm$^3$ and $8\times10^{18}$ atom/cm$^3$. Particularly, the on/off ratio was highest in an impurity doping concentration of $8\times10^{18}$ atom/cm$^3$. On the other hand, the on/off ratio was very low in impurity doping concentrations of $1\times10^{20}$ atom/cm$^3$, $5\times10^{19}$ atom/cm$^3$, $4\times10^{19}$ atom/cm$^3$, and $3\times10^{19}$ atom/cm$^3$.

Generally, when using the junctionless vertical gate transistor for a semiconductor device such as DRAM and the like, it is advantageous to have a high on/off ratio in order to secure sufficient read/write operation. In particular, in order to use the junctionless vertical gate transistor according to an embodiment of the present invention for a semiconductor device such as DRAM and the like, it is preferable that the doping concentration of impurities in the active pillar 120 may range from $8\times10^{18}$ atom/cm$^3$ to $3\times10^{19}$ atom/cm$^3$ so as to provide a sufficient on/off ratio while maintaining sufficient on-current. If the doping concentration of impurities in the active pillar 120 is less than $8\times10^{18}$ atom/cm$^3$, a threshold voltage can be increased with an increase in resistance of the source and the drain regions, making it difficult to obtain rapid operation of the semiconductor device. On the contrary, if the doping concentration of impurities in the active pillar 120 exceeds $3\times10^{19}$ atom/cm$^3$, it is difficult to obtain a sufficient difference between on-current and off-current for operation of the device.

Figure 6:
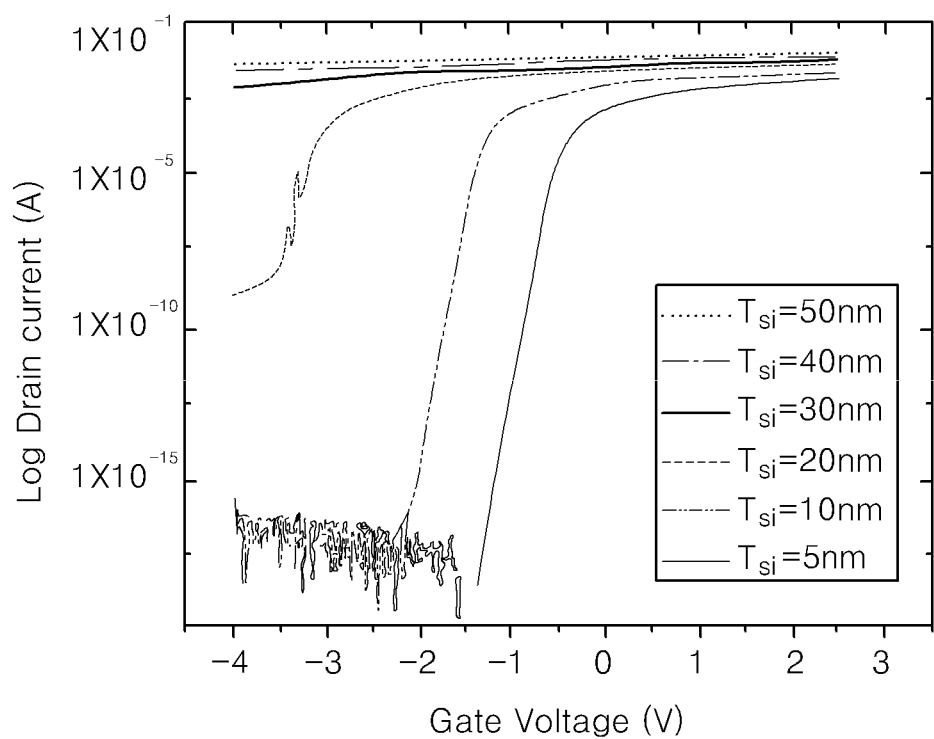
FIG. 6 is a graph depicting a relation between a gate-voltage and a drain-current depending on a silicon thickness of an active region of a DRAM having a junctionless vertical gate transistor according to the first embodiment of the present invention.

FIG. 6 is a graph depicting a relation between a gate-voltage and a drain-current depending on a silicon thickness of an active pillar of a DRAM employing the junctionless vertical gate transistor according to the first embodiment of the present invention.

In FIG. 6, to obtain a drain-current on/off ratio with respect to a gate-voltage, devices were used each of which employs a dual-gate electrode composed of molybdenum (Mo) and has work functions of 5.25 eV. In each device, the gate insulation layer had a thickness (Tox) of 5 nm and the doping concentrations of impurities in the active pillar was $1\times10^{19}$ atom/cm$^3$, The active pillars have thicknesses (Tsi) of 5 nm, 10 nm, 20 nm, 30 nm, 40 nm and 50 nm, respectively.

Referring to FIG. 6, the on/off ratio decreased with increasing thickness (Tsi) of the active pillar. In particular, when the active pillar had a thickness (Tsi) of 20 nm or less, it was possible to obtain a sufficient on/off ratio through the gate electrodes. However, when the active region had a thickness (Tsi) exceeding 20 nm, a sufficient on/off ratio through the gate electrodes was not obtained Thus, according to the present invention, a thickness of the active pillar, that is, a distance between two neighboring gate electrodes may be in the range from 10 nm to 20 nm in order to provide a sufficient on/off ratio through the gate electrodes 160 with the doping concentration within the aforementioned range in use for a semiconductor device such as DRAM and the like. If a thickness of the active pillar 120 is less than 10 nm, it is difficult to form such a thin active pillar, and if a thickness of the active pillar 120 exceeds 20 nm, a sufficient on/off ratio through the gate electrodes cannot be obtained.

For process convenience, the gate electrodes 160 may be formed over first and second sidewalls of the active pillar 120 to be disposed over the second impurity region 120b to form a linear type dual-gate. The second sidewall is disposed opposite to the first sidewall. Here, since the gate electrodes 160 are arranged in a direction perpendicular to the surface of the substrate 110, the gate electrodes 160 can be referred to as vertical gates.

The gate electrodes 160 may be formed of electrically conductive materials, for example, a metallic material having substantially the same work function (about 5.25 eV) as that of p$^+$-doped polysilicon. In some embodiments, the gate electrodes 160 may be formed of molybdenum (Mo), nickel (Ni), platinum (Pt), ruthenium oxide (RuO$_2$), or the like. Although not shown in the drawings, each of the gate electrodes 160 extends in one direction to form a word line.

Meanwhile, in a second embodiment as shown in FIG. 7, the gate electrode 160 may be formed over one sidewall of the active pillar 120, rather than being formed over both of the first and the second sidewalls. The gate insulation layer 150 may be interposed between the gate electrode 160 and the second impurity region 120b of the active pillar 120. As in the case of forming the dual-gate 160, it is possible to obtain a high on/off ratio.

In addition, although not shown in the drawings, the gate electrodes may be formed as surrounding gates, which partially or completely surround the sidewalls of the active pillar 120 in the second impurity region, thereby providing a higher on/off ratio than the dual-gate.

Referring to FIG. 1 to FIG. 4, the gate insulation layer 150 is interposed between the active pillar 120 in the second impurity region 120b and the gate electrode 160. For example, the gate insulation layer 150 may be composed of a silicon oxide (SiO$_2$) layer or a dielectric (high-k) layer which has a higher dielectric constant than the silicon oxide (SiO$_2$) layer.

The gate insulation layer 150 may include a vertical insulation section 150a formed over a sidewall of the active pillar 120 in the second impurity region 120b and a horizontal insulation section 150b extending from a lower portion of the vertical insulation section 150a to over a surface of the first impurity region 120a between the second impurity regions 120b. The gate insulation layer 150 may be formed on one sidewall of the second impurity region 120b or may be formed to extend to a sidewall of the third impurity region 120c so long as it can be formed between the gate electrodes 160 and the second impurity region 120b.

Figure 8:
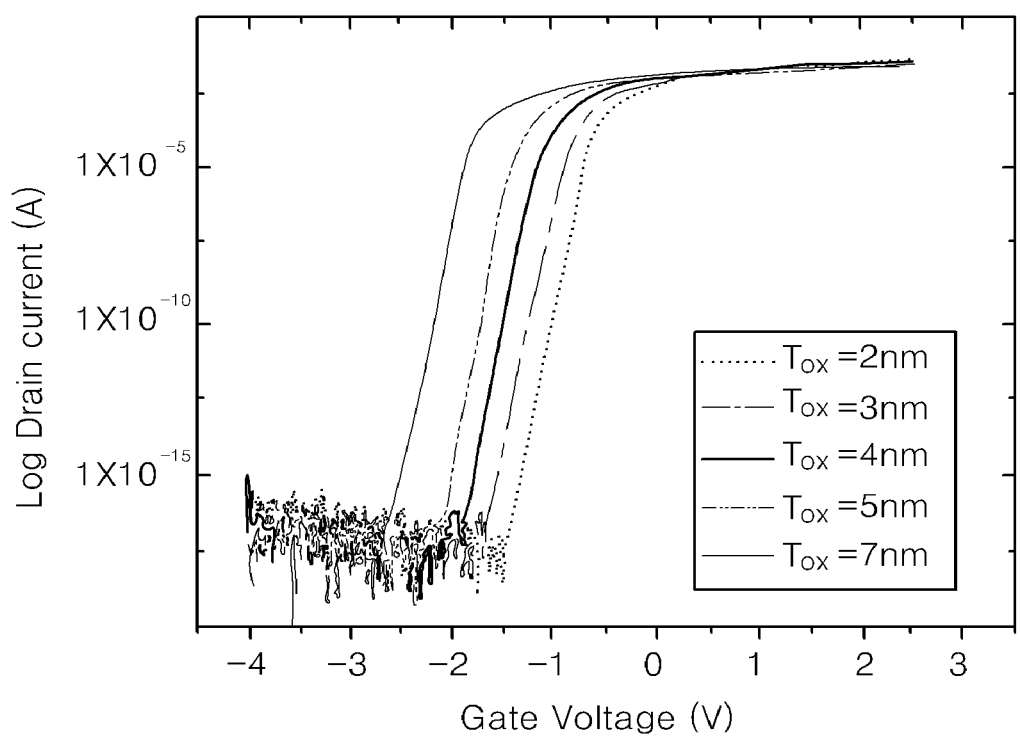
FIG. 8 is a graph depicting a relation between a gate-voltage and a drain-current depending on a thickness of a gate insulation layer of a DRAM having a junctionless vertical gate transistor according to the first embodiment of the present invention.

FIG. 8 is a graph depicting a relation between a gate-voltage to a drain-current according to a thickness of a gate insulation layer of a DRAM having a junctionless vertical gate transistor as shown in FIG. 1. Here, not only in FIG. 8 but also throughout the specification, a thickness of the gate insulation layer is defined as a distance between the second impurity region and the gate electrode.

In FIG. 8, a drain-current on/off ratio with respect to a gate-voltage applied via dual-gate electrodes was detected using the device according to the first embodiment of the present invention which employs a dual-gate electrode. The dual-gate electrode is composed of molybdenum (Mo) and has a work function of 5.25 eV. The active pillar had a thickness (Tsi) of 10 nm. Experiments were performed with devices with gate insulation layers whose thicknesses (Tox) are 2 nm, 3 nm, 4 nm, 5 nm and 7 nm, respectively.

Referring to FIG. 8, the on/off ratio was decreased with increase of a thickness of the gate insulation layer (Tox). Particularly, when the gate insulation layer had a thickness (Tox) of 2 nm, a threshold voltage value obtained is suitable for operation of the DRAM and sufficient for a proper on/off operation as well.

Thus, according to the present invention, in the gate insulation layer 150, the vertical insulation section 150a may be formed to a thickness of 3 nm or less, preferably in the range from 1 nm to 3 nm, in order to provide a sufficient threshold voltage for operation of the device and a proper on/off operation of the gate electrodes 160 under such a doping concentration condition in the active pillar 120 as aforementioned.

If the thickness of the vertical insulation section 150a of the gate insulation layer 150 is less than 1 nm, short circuit can occur between the gate electrodes 160 and the active region 120. On the contrary, if the thickness exceeds 3 nm, it is difficult to obtain a sufficient on/off ratio through the gate electrodes 160 in a given doping concentration which is aforementioned, causing a difficulty in operation of the device.

Here, the active region 120, the gate insulation layer 150, and the gate electrodes 160 constitute a transistor. Since the first to third impurity regions 120a, 120b, 120c of the active region 120 include the impurities of the same polarity and have substantially the same concentration and the gate electrodes 160 are formed perpendicular to the surface of the substrate 110, such a transistor may be referred to as the junctionless vertical gate transistor.

Figure 9:
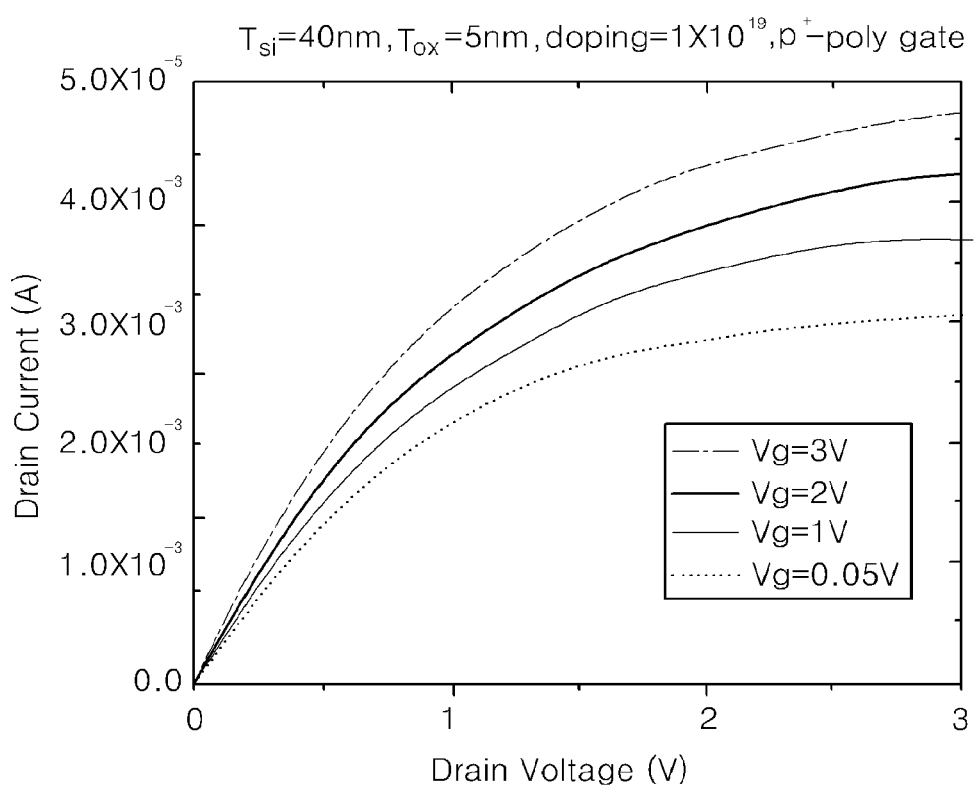
FIG. 9 is a graph depicting a relation between a drain-voltage and a drain-current depending on a gate voltage applied to an active region of a DRAM having a junctionless vertical gate transistor according to the first embodiment of the present invention.
Figure 10:
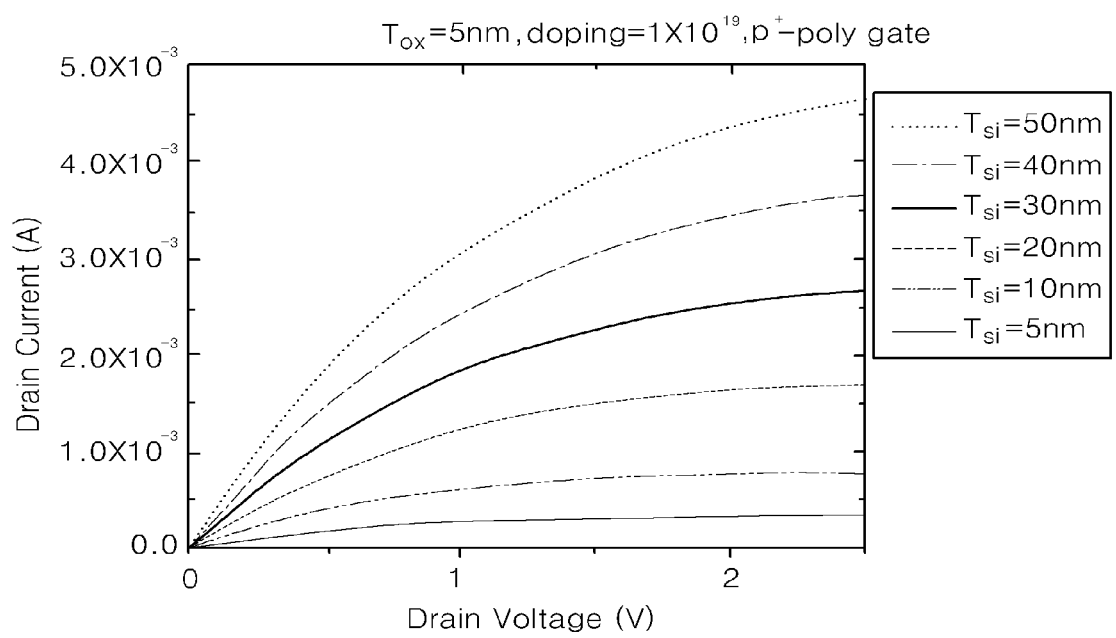
FIG. 10 is a graph depicting a relation between drain-voltage and a drain-current depending on a silicon thickness of an active region of a DRAM having a junctionless vertical gate transistor according to the first embodiment of the present invention.

FIG. 9 is a graph depicting a relationship between a drain-voltage to a drain-current depending on a gate voltage which is obtained using a DRAM having the junctionless vertical gate transistor according to the first embodiment of the present invention employing a dual-gate electrode. FIG. 10 is a graph depicting a relationship between a drain-voltage to a drain-current depending on a silicon thickness of an active pillar of a DRAM having the junctionless vertical gate transistor according to the first embodiment of the present invention.

In FIG. 9, a drain-voltage with respect to a drain-current depending on a gate voltage applied via dual-gate electrodes (p$^-$ poly gate level) using the first embodiment of the present invention. The dual-gate electrodes 160 was composed of molybdenum (Mo) and each had work functions of 5.25 eV. The active pillar had a thickness (Tsi) of 40 nm, a doping concentration was 1×10$^{19}$ atom/cm$^3$, and gate voltages were set to 0.05V, 1V, 2V and 3V, respectively.

Referring to FIG. 9, the relationship between a drain-voltage and a drain-current of the DRAM having the junctionless vertical gate transistor according to an embodiment of the present invention was detected while applying different gate voltages. As shown in FIG. 9, it is confirmed that the DRAM according to an embodiment of the present invention is free from kink phenomenon from the fact that the drain current keep increasing, rather than being saturated, when the drain voltage increases.

When a DRAM cell employs a conventional vertical gate transistor, floating body effect should be taken into consideration which is caused by absence of body contact.

However, since the junctionless vertical gate transistor according to an embodiment of the present invention has no junction between the third impurity region 120c and the second impurity region 120b, and between the first impurity region 120a and the second impurity region 120b (that is, there is no junction either between the source and the body and between the drain and the body), the junctionless vertical gate transistor has a lower electrical barrier between the source and the body than that of the conventional vertical gate transistor, and allows holes move to the source, thereby providing various advantages to the DRAM cell, including effective elimination of the floating body effect.

Further, since there is no difference in doping concentration between the third impurity region 120c and the second impurity region 120b, and between the first impurity region 120a and the second impurity region 120b (that is, between the source and the body and between the drain and the body), and an intensity of electric field becomes relatively weakened in junctions between the third impurity region 120c and the second impurity region 120b, and between the first impurity region 120a and the second impurity region 120b (that is, in junctions between the source and the body and between the drain and the body), an effect resulting from ionization or gate induced drain leakage (GIDL) is insignificant.

In FIG. 10, a relationship between a concentration of carriers, e.g., holes and a thickness (Tsi) of the active pillar is detected using a device employing dual-gate electrodes (p$^+$ poly gate level) according to the first embodiment of the present invention. Each of the dual-gate electrodes is composed of molybdenum (Mo) and has a work function of 5.25 eV. The thickness (Tox) of a gate insulation layer was set to 5 nm, the doping concentration was set to 1×10$^{19}$ atom/cm$^3$, and the thickness (Tsi) of the active pillar was set to 5 nm, 10 nm, 20 nm, 30 nm, 40 nm, and 50 nm, respectively.

As can be seen from FIG. 10, even when the thickness (Tsi) of the active pillar was decreased from 50 nm to 10 nm, the carrier concentration in the body region was not increased.

In the junctionless vertical gate transistor according to an embodiment of the present invention, when the gate electrodes 160 are in an off-state, that is, Vg≤Vt where Vg is a gate voltage and Vt is a threshold voltage, the channel region is in a depletion state, so that the transistor is operated without electric current flowing through the transistor. On the contrary, when the gate electrodes 160 are in an on-state, that is, Vg≥Vt, the channel region is in an accumulation state, so that electric current flows through the transistor when voltage is applied to the drain. In operation, the DRAM performs write operation in the accumulation state of the junctionless vertical gate transistor, and becomes a stand-by state in the depletion state of the junctionless vertical gate transistor.

As such, in the junctionless vertical gate transistor according to an embodiment of the present invention, the source, drain and body regions are doped with impurities and have substantially the same concentration. Thus, the junctionless vertical gate transistor according to an embodiment of the present invention does not suffer from junction current leakage, and thus exhibits good characteristics for a transistor for memory device. Thus, high density DRAMs with excellent characteristics can be obtained.

The semiconductor device 100 according to an embodiment according to the present invention includes the junctionless vertical gate transistor which exhibits excellent characteristics for a transistor for memory device.

Referring again to FIG. 1 to FIG. 4, the bit line 130 is buried in the first insulation layer 125 between adjacent first impurity regions 120a and contacts at one sidewall with the first impurity region 120a and arranged cross to a word line (not shown). In other words, the bit line 130 is electrically connected to the first impurity region 120a at the one sidewall.

The bit line 130 is isolated from the word line by a thickness of a horizontal insulation section 150b of the gate insulation layer 150. The horizontal insulation section 150b of the gate insulation layer 150 may have a thickness ranging from 50 nm to 100 nm in order to prevent short circuit between the bit line 130 and the word line. If the thickness of the horizontal insulation section 150b of the gate insulation layer 150 is less than 50 nm, short circuit can occur between the bit line 130 and the word line, and if the thickness exceeds 100 nm, it is difficult to achieve high integration of the device and channel characteristics are deteriorated.

Such bit lines 130 may be formed of an electrically conductive material having low resistance in order to reduce resistance. The bit lines 130 may be formed of a metallic material, for example, tungsten (W). Alternatively, the bit lines 130 may be composed of a silicide layer. For example, the silicide layer may include tungsten silicide, titanium silicide, cobalt silicide, nickel silicide, and the like. Alternatively, the bit lines 130 may be formed of a polysilicon material.

In the semiconductor device 100, the first isolation layer 125 is formed (i) under the bit lines 130 and (ii) over the substrate exposed between the bit line 130 and the first impurity region 120a. In addition, the second isolation layer 140 is formed over sidewalls of the active pillar 120 of above the bit lines 130 and over the first isolation layer 125. Further, the third isolation layer 170 is formed (i) between the gate electrodes 160 and (ii) between the gate insulation layers 150 above the gate electrodes 160 to prevent short circuit between adjacent gate electrodes 160. The active pillars 120 are electrically isolated from each other by the first to third isolation layers 125, 140, 170, so that adjacent cells are electrically isolated from each other.

The first, second, and third isolation layers 125, 140, 170 may be formed of a same material or a different materials. The first to the third isolation layers 125, 140, 170 may be composed of typical insulation materials, for example, silicon oxide, silicon nitride, borophosphosilicate glass (BPSG), phosphosilicate glass (PSG), spin-on-glass (SOG), polysilazane (PSZ), tetrahydroxysilane ($O_3$-TEOS), high density plasma (HDP) oxide, an atomic layer deposition (ALD) oxide layer, which may be used alone or in combination thereof, without being limited thereto.

Meanwhile, in a further embodiment as shown in FIG. 11, the bit lines 130 may be buried within the substrate 110 under the first impurity regions 120a, rather than being disposed at the same level with the first impurity regions 120a. In this case, the bit line 130 is formed over liner insulation layer 172, which is formed along inner sidewalls of a recess formed in the substrate 110. Accordingly, each of the bit lines 130 has an upper side adjoining the first impurity region 120a and a lower surface and sidewalls surrounded by the liner insulation layer 172, thereby preventing short circuit with the substrate 110. Here, the bit line 130 may be formed of a conductive material, for example, metal, metal silicide, polysilicon, and the like. Alternatively, the bit line 130 may be formed by ion implantation performed into the substrate 110.

A gap between adjacent first impurity regions 120a is filled with the second insulation layer 140. With this configuration, it is advantageous in that short circuit between the word line and the bit line 130 is prevented.

In this embodiment, the semiconductor device 100 employing the junctionless vertical gate transistor may exhibit improved characteristics of the transistor as a result of elimination of junction current leakage between the first impurity region 120a and the second impurity region 120b, and between the third impurity region 120c and the second impurity region 120b, thereby creating a highly integrated $4F^2$ cell structure showing excellent electrical properties and reliability.

Meanwhile, although a DRAM is mentioned as an example which may employing a junctionless vertical gate transistor according to the present invention, the present invention is not limited thereto and can be applied to other devices other than a DRAM. That is, it should be understood that a junctionless vertical gate transistor according to the present invention may be applied not only to the DRAM but also to other semiconductor devices.

Next, a method of manufacturing a semiconductor device using a junctionless vertical gate transistor according to one embodiment of the invention will be described.

FIGS. 12, 15, 18, 21, 24, 27 and 30 are plan views of a method of manufacturing a semiconductor device in accordance with an embodiment of the present invention; FIGS. 13, 16, 19, 22, 25, 28 and 31 are cross-sectional views taken along the line A-A' of FIGS. 12, 15, 18, 21, 24, 27 and 30, respectively; and FIGS. 14, 17, 20, 23, 26, 29 and 32 are cross-sectional views taken along the line B-B' of FIGS. 12, 15, 18, 21, 24, 27 and 30, respectively Referring to FIG. 12 to FIG. 14, a substrate 110 in an active region is etched in a first direction to form a plurality of pillars P separated from each other by a plurality of first trenches T1 arranged at constant intervals.

The substrate 110 may be composed of silicon (Si) substrate, a silicon germanium (SiGe) substrate, a germanium (Ge) substrate, a III-V group compound semiconductor substrate, and the like, and may include a nano structure such as nano wires or nano ribbons. When the substrate 110 is a silicon substrate, the pillars P may be silicon pillars.

Each of the pillars P vertically protrudes from the substrate 110 where the trench T1 is not formed, to provide an active region of a transistor.

Such a pillar P may be formed to a thickness ranging from 10 nm to 20 nm which is proper to provide a sufficient on/off ratio. On/off operation is performed using a voltage applied through the gate electrode into the active region. The active region is doped with impurities.

The first trenches T1 may be formed through typical photolithography technology. For example, the first trenches T1 may be formed by coating a photosensitive material on the substrate 110 to form a photosensitive layer (not shown), patterning the photosensitive layer using a predesigned mask to form a photosensitive layer pattern (not shown) extending in a first direction, and etching the upper surface of the substrate using the photosensitive layer pattern as an etching mask.

However, since the first trench T1 has a high aspect ratio, the upper side of the substrate 110 can be damaged when the substrate 110 is subjected to etching using only the mask. Thus, before forming the photosensitive layer, a hard mask layer (not shown) including nitride, oxide, SiON, amorphous carbon, or a combination thereof may be formed between the substrate 110 and the photosensitive layer.

By way of example, when the substrate 110 is a silicon substrate, the pillars P may be formed by a dry etching process using chlorine ($Cl_2$) gas, HBr gas, or a mixture of chlorine ($Cl_2$) gas and HBr gas.

Figure 14:
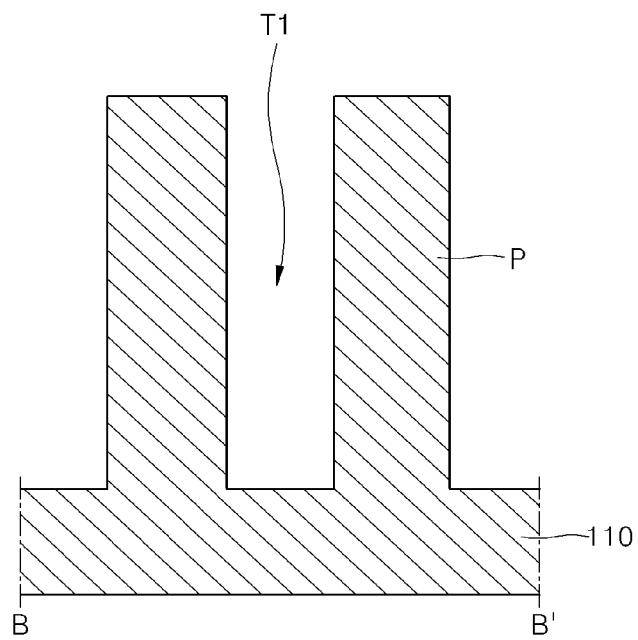
FIGS. 14, 17, 20, 23, 26, 29 and 32 are cross-sectional views taken along the lines B-B' of FIGS. 12, 15, 18, 21, 24, 27 and 30, respectively.
Figure 15:
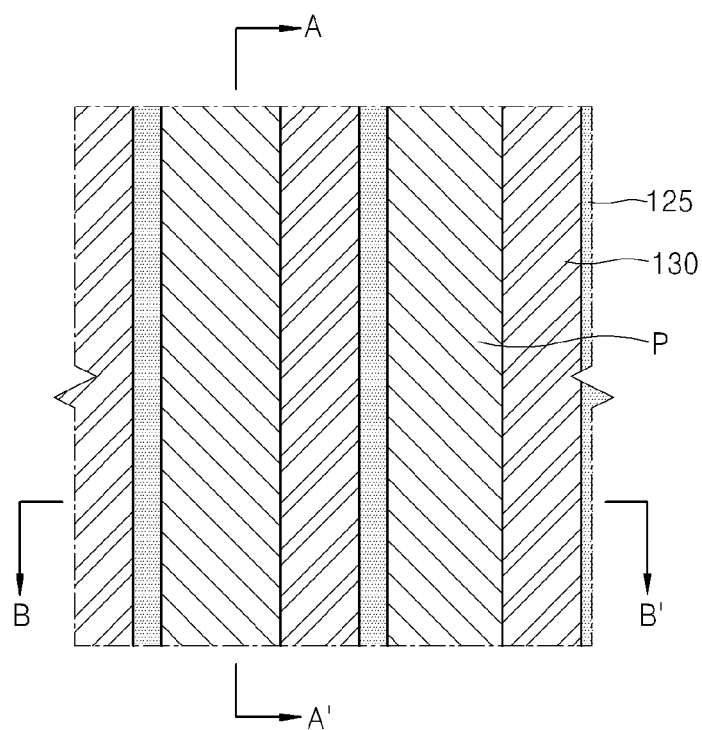
Figure 16:
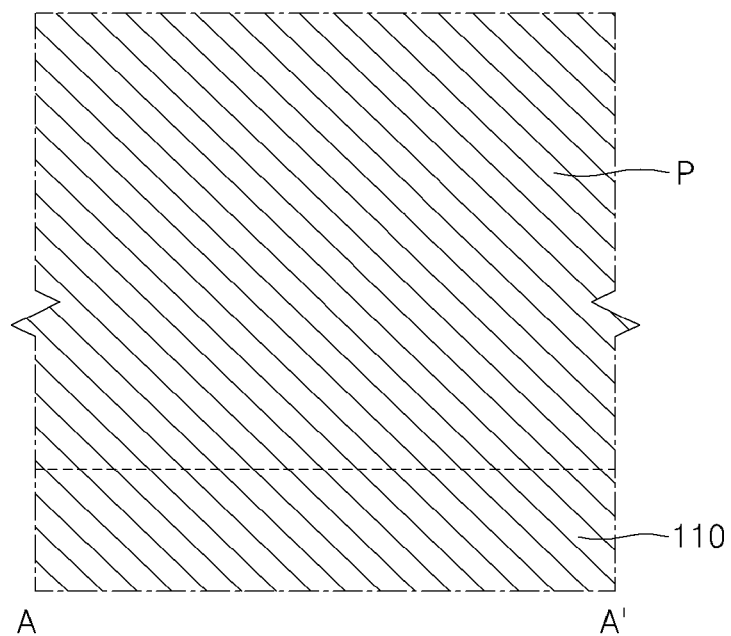
Figure 17:
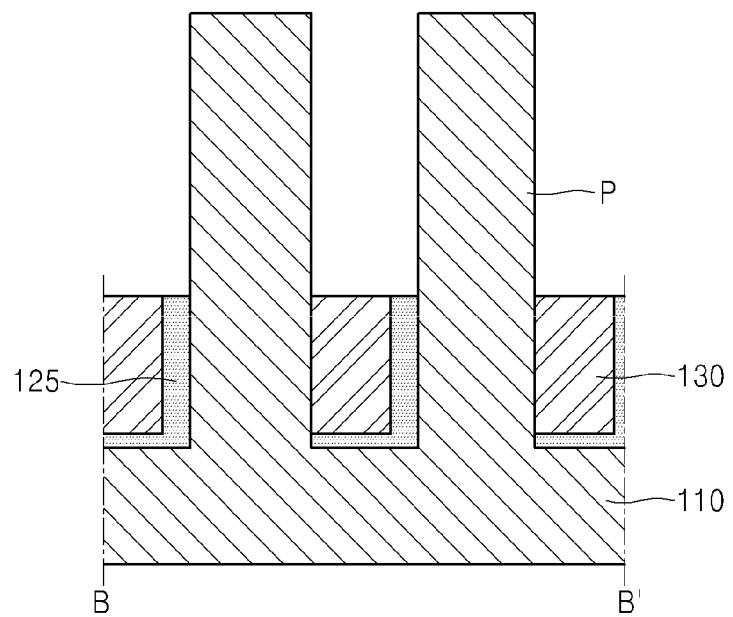

Referring to FIG. 15 to FIG. 17, a first isolation layer 125 is formed over a bottom surface of the first trench Ti (see FIG. 14) and a lower portion of one sidewall of the first trench T1 (see FIG. 14), and a bit line 130 fills the trench T1 between the first insulation layer 125 and the pillar P (see FIG. 14).

More specifically, first, an insulation layer (not shown) is formed by depositing an insulation material along an inner wall of the first trench T1 (see FIG. 14). Then, the insulation layer (not shown) is subjected to a selective etching process until one sidewall of the pillar P is exposed, thereby forming the first insulation layer 125 over the bottom of the first trench T1 (see FIG. 14) and one sidewall of the pillar P at the lower portion of the first trench T1 (see FIG. 14). The insulation layer for forming the first isolation layer 125 may be formed by chemical vapor deposition (CVD) or atomic layer deposition (ALD).

Then, a metallic material having low resistance is deposited over the first insulation layer 125 using a deposition process such as physical vapor deposition (PVD), chemical vapor deposition (CVD), metal organic chemical vapor deposition (MOCVD), and the like. As a result, the first trench T1 (see FIG. 14) is filled with the metallic material. Then, the metal layer is subjected to a selective etching process until an upper surface of the first isolation layer 125 is exposed, thereby forming bit lines 130, each of which contacts with a pillar P at one sidewall.

The bit lines 130 may be formed of tungsten silicide, titanium silicide, cobalt silicide, nickel silicide, and the like through an additional silicide process.

The first isolation layer 125 is placed to allow each bit line 130 to contact a lower portion of one sidewall of the pillar P. Such a bit line 130 is a buried bit line.

Although the bit line 130 is illustrated as a line type, the bit line 130 may have any shape so long as the bit line is formed to contact a lower portion of the pillar P at one sidewall. The lower portion of the pillar P will become a first impurity region in a subsequent process.

Figure 18:
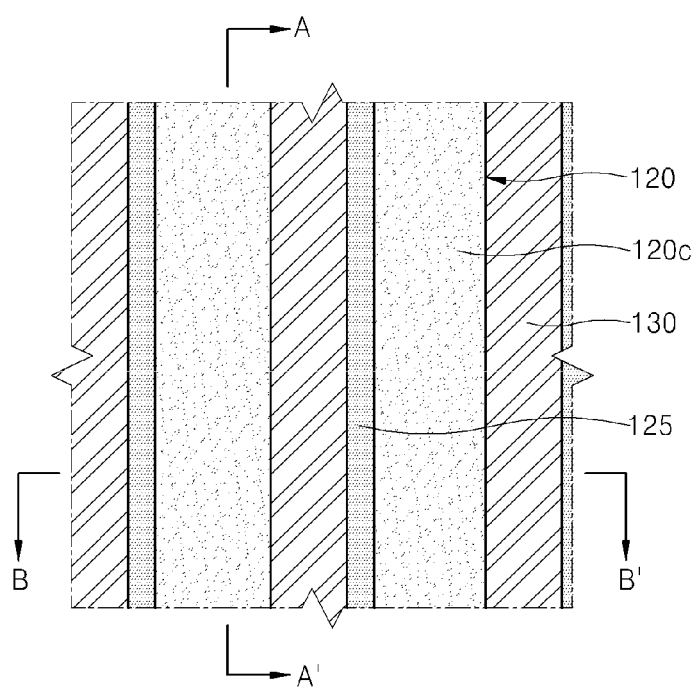
Figure 19:
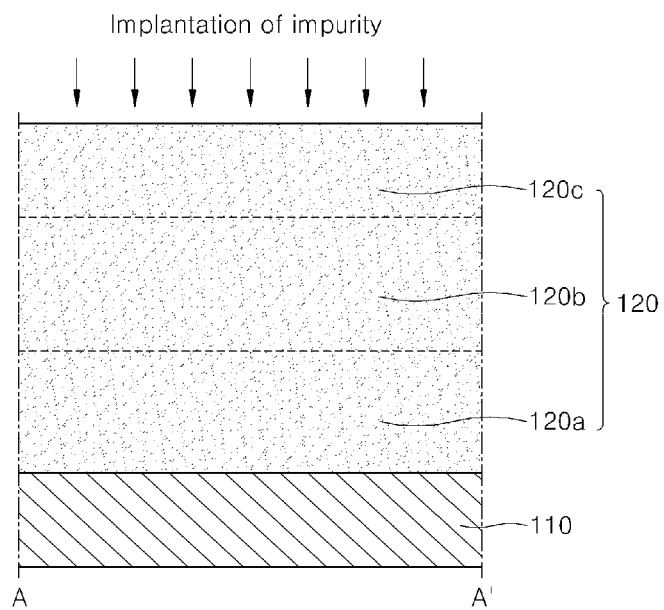
Figure 20:
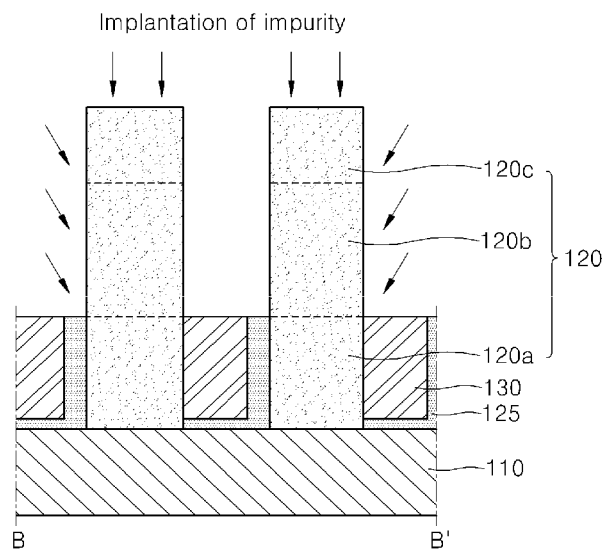

Referring to FIG. 18 to FIG. 20, an impurity is implanted into the plurality of pillars P (see FIG. 17).

The process of implanting an impurity into the pillars P (see FIG. 17) may be carried out so that the pillar P has a doping concentration ranging from $8 \times 10^{18}$ to $3 \times 10^{19}$ atom/$cm^3$. The process may include multi ion implantation, tilt ion implantation, and oriented ion implantation, alone or in combination thereof. The implantation process is performed while moving the substrate 110 in front, rear, right or left directions.

Then, both of the second impurity regions 120b and the third impurity regions 120c are formed through an in-situ process over the first impurity regions 120a.

Here, ion implantation may be performed while changing ionization energy to allow impurities of the same polarity to be uniformly implanted such that the pillars P (see FIG. 17) have substantially the same concentration of impurities from lower portion to the top of each pillar.

When the substrate 110 is a silicon substrate, the ion implantation may be performed using N-type impurities such as arsenic (As), phosphorus (P), bismuth (Bi), antimony (Sb), and the like. Alternatively, when the substrate 110 is a silicon germanium (SiGe) substrate, a germanium (Ge) substrate, or a III-V group compound semiconductor substrate, the ion implantation may be performed using P-type impurities, such as aluminum (Al), boron (B), indium (In), gallium (Ga), and the like.

As a result, each of the pillars P (see FIG. 17) may form an active pillar 120, which includes the first impurity region 120a, the second impurity region 120b, and the third impurity region 120c, which are sequentially formed from the lower part thereof and include impurities of the same polarity and have substantially the same concentration ranging from $8 \times 10^{18}$ to $3 \times 10^{19}$ atom/$cm^3$.

Although the active pillars 120 are illustrated as including the first to third impurity regions 120a 120b, 120c formed through impurity implantation, the first to third impurity regions 120a, 120b, 120c of the active pillars 120 may be defined by places where gate electrodes are formed in a subsequent process.

Here, the first impurity region 120a may correspond to a drain region, which will be electrically connected to the bit line 130. The second impurity region 120b may correspond to a body region or a channel region interposed between the first impurity region 120a and the third impurity region 120c, and the third impurity region 120c may correspond to a source region, which will be electrically connected to a storage node contact plug (or a capacitor lower electrode), which are formed by subsequent processes.

As the first impurity region 120a is separated by a certain distance from the third impurity region 120c in the vertical direction, a vertical channel is formed between the first impurity region 120a and the third impurity region 120c.

The first to the third impurity regions 120a, 120b, 120c are formed by uniformly implanting impurities of the same kind, thereby providing a uniform doping profile. In addition, unlike a conventional technique where impurities implanted into the source and drain regions are different from the channel region, the present invention has neither doping concentration gradient, nor drastic change in the doping profile between the channel and the source and between the channel and the drain regions. In addition, there is no dopant transformation due to the impurities implanted in the substrate 110 in the active region. Thus, conventional problems related to process complexity and difficulty for impurity implantation can be solved, thereby improving productivity and a process yield.

Furthermore, since the first, second, and third impurity regions 120a, 120b, 120c are formed by implanting the same kind of impurity, there is no junction interface either between the first impurity region 120a and the second impurity region 120b, or between the third impurity region 120c and the second impurity region 120b. Thus, junction current leakage can be effectively prevented.

Meanwhile, after ion implantation, in order for uniform distribution of the implanted impurity within the active region

120, the method may further include annealing at 900 to 1100 Celsius degrees, for example, using rapid thermal annealing (RTA).

Figure 21:
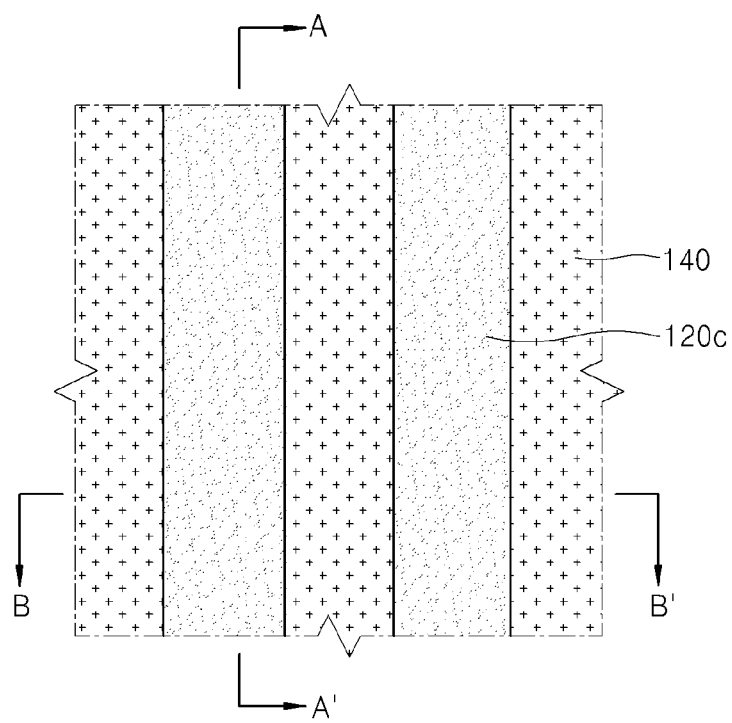
Figure 22:
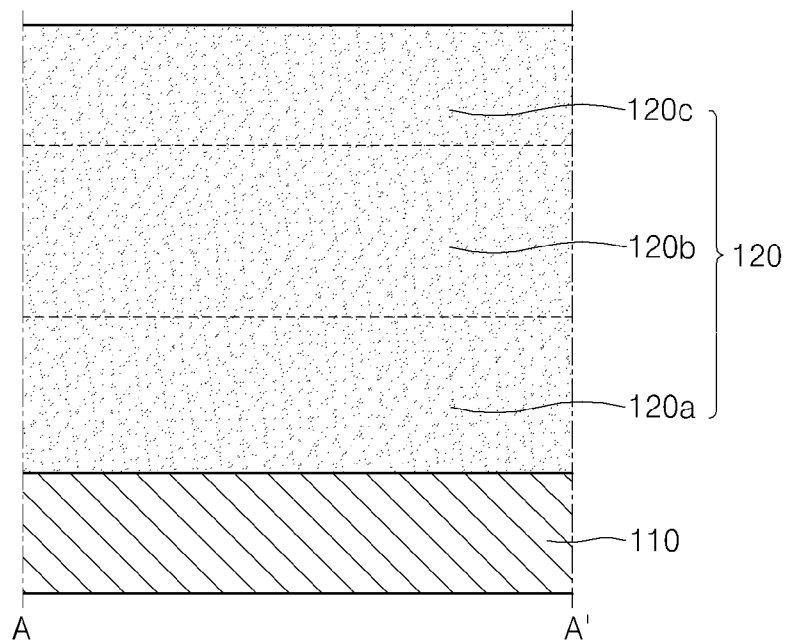
Figure 23:
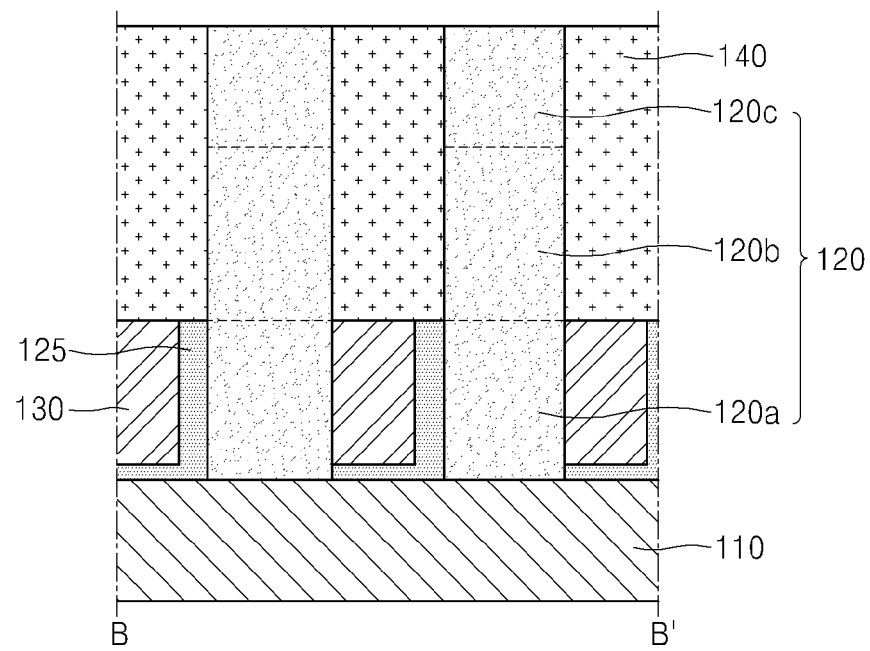

Referring to FIG. 21 to FIG. 23, a second isolation layer 140 is formed to fill a gap between the active pillars 120. The second isolation layer 140 is formed above the bit lines 130 and the first isolation layer 125. In this case, the second isolation layer 140 is formed over sidewalls of the second and third impurity regions 120b, 120c.

The second isolation layer 140 may be formed by depositing a silicon oxide layer, a silicon nitride layer, a BPSG layer, a PSG layer, a SOG layer, a PSZ layer, an $O_3$-TEOS layer, a HDP oxide layer, an ALD oxide layer or the like via CVD or ALD to fill a gap which is disposed between the active pillars and above the bit line 130 and the first isolation layer 125. Then, the second isolation layer 140 may be subject to a chemical mechanical polishing (CMP) or an etch-back process until an upper surface of the active region 120 is exposed. In this way, the second isolation layer becomes planarization with the upper surface of the active region 120.

Figure 24:
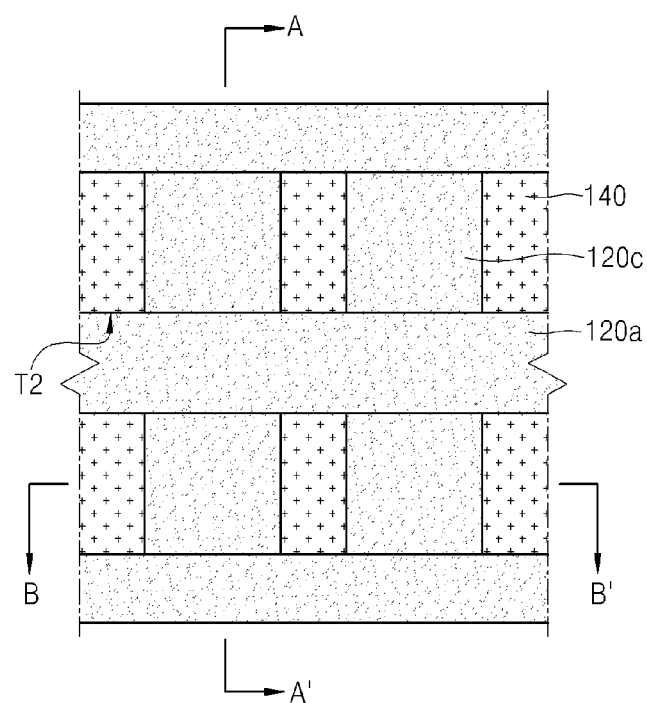
Figure 25:
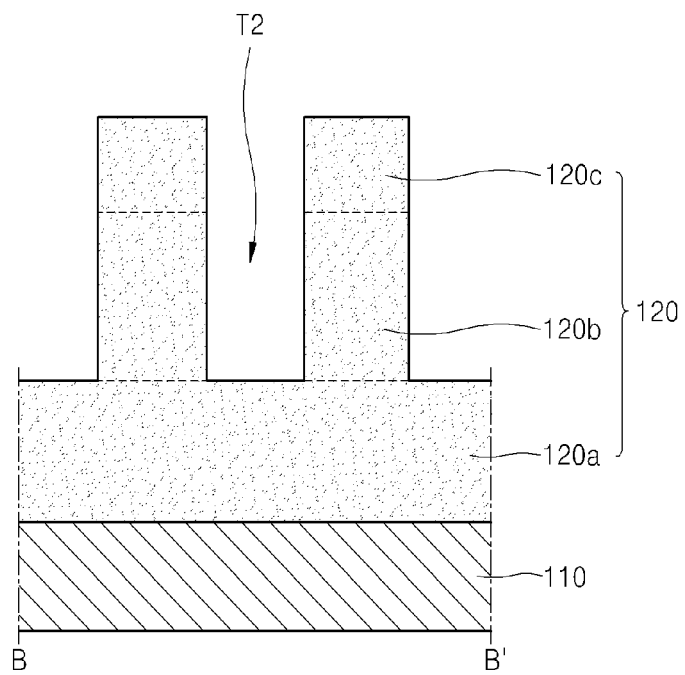
Figure 26:
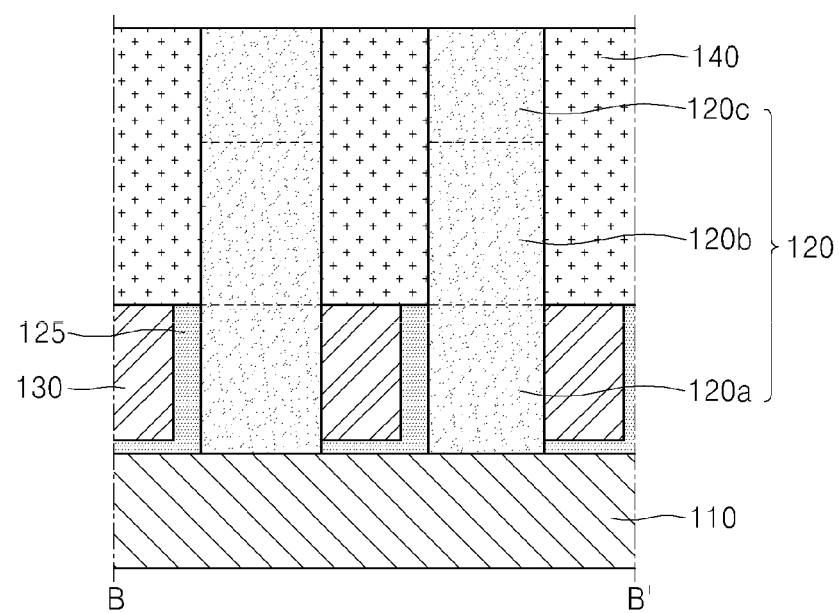

Referring to FIG. 24 to FIG. 26, a plurality of second trenches T2 is formed by etching the active pillars 120 in a second direction cross to the bit lines 130 to a depth corresponding to the upper surface of the first impurity region 120a.

Figure 27:
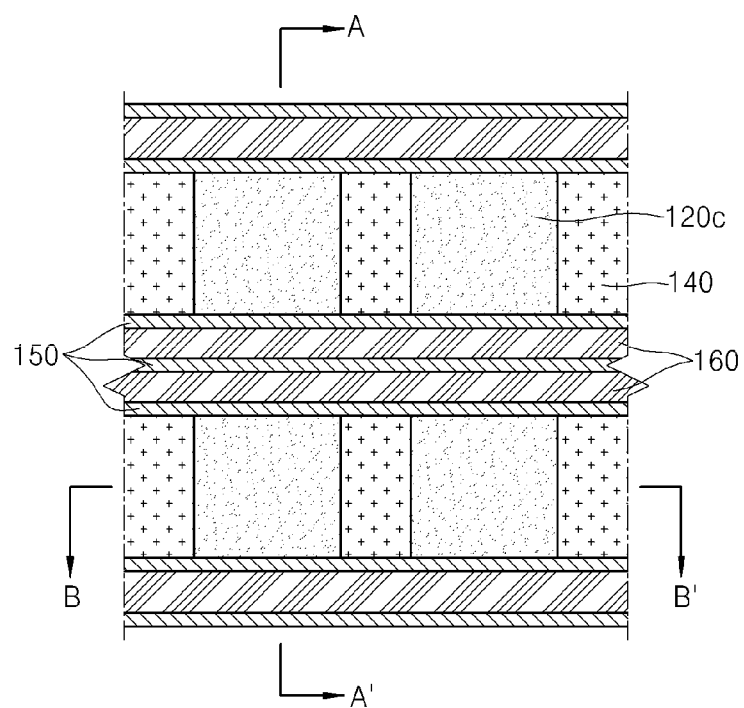
Figure 28:
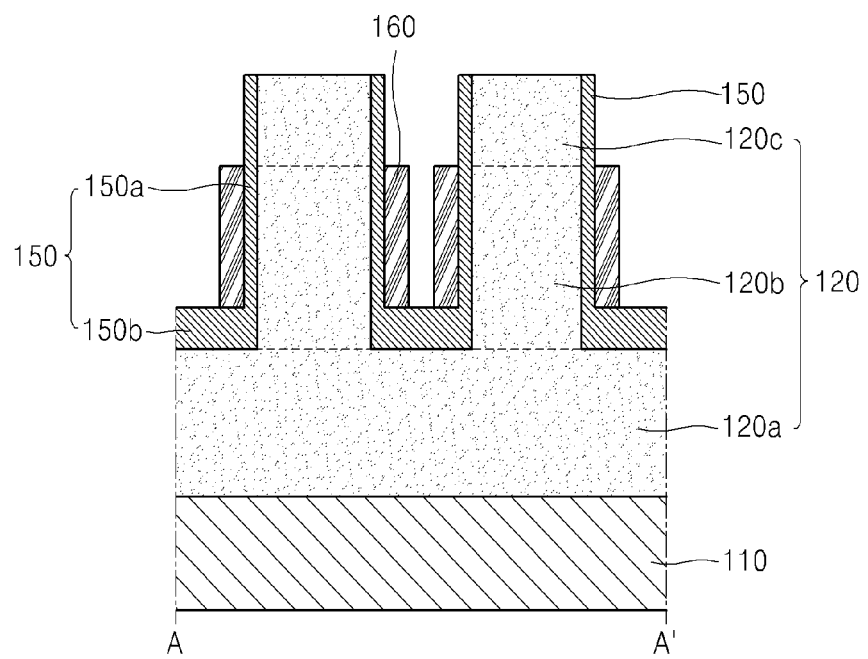
Figure 29:
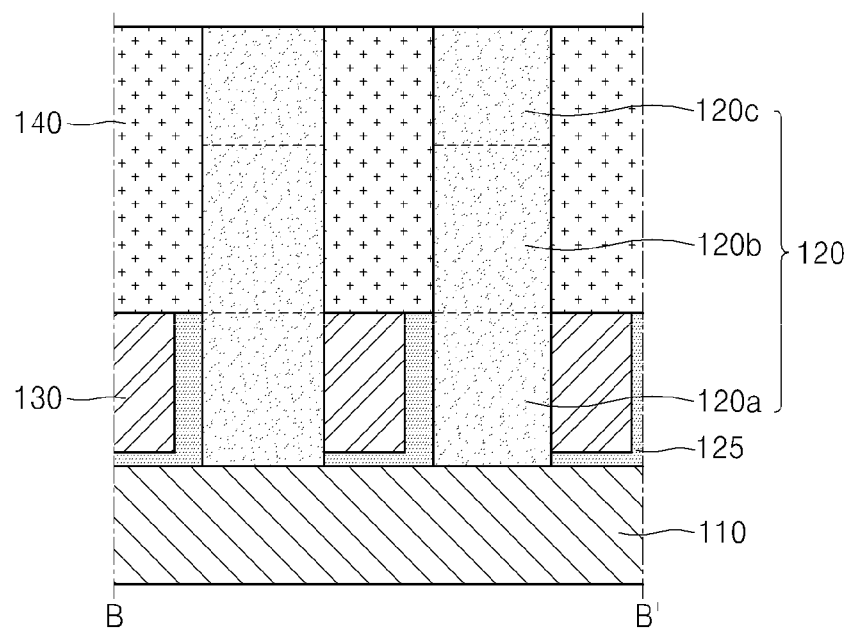

By way of example, when the substrate 110 is a silicon substrate, etching for forming the second trenches T2 may be performed by a dry etching process using chlorine ($Cl_2$) gas, HBr gas, or a mixture of chlorine ($Cl_2$) gas and HBr gas Referring to FIG. 27 to FIG. 29, a gate insulation layer 150 is formed over sidewalls of the second and third impurity regions 120b, 120c and over the bottom surfaces of the second trenches T2. The gate insulation layer 150 is arranged in the second direction cross to the bit lines 130.

The gate insulation layer 150 may be embodied by a silicon oxide layer ($SiO_2$), which is formed by radical oxidation and then subjected to a selective etching process. Alternatively, the gate insulation layer 150 can be formed of a high dielectric (high-k) layer by (i) depositing a high dielectric material having a higher dielectric constant than the silicon oxide layer $SiO_2$ to form a high dielectric material layer through CVD, and then (ii) performing a selective etching process to the dielectric material layer.

Particularly, when using radical oxidation or CVD, the insulation layer may be formed thicker at a bottom surface of the second trenches T2 than over a sidewall of the active region 120. Accordingly, the gate insulation layer 150 has a horizontal insulation section 150b, which is formed at the bottom surface of the second trench T2 and extends perpendicular to a vertical insulation section 150a, thicker than a vertical insulation section 150a, which is formed over the sidewall of the second and the third impurity regions 120b, 120c.

Then, gate electrodes 160 are formed over two sidewalls of the second impurity region 120b having the gate insulation layer 150 there between. The gate electrodes 160 each provided over two sidewalls of the second impurity region 120b collectively form of a dual gate.

The gate electrodes 160 may be formed of an electrically conductive material, for example, a metallic material having the same work function (about 5.25 eV) as p+-implanted polysilicon. By way of example, the gate electrodes 160 may be formed of molybdenum (Mo), nickel (Ni), platinum (Pt), ruthenium oxide ($RuO_2$), and the like. Specifically, a metal layer fills a gap between adjacent active regions 120 formed over the gate insulation layer 150, and is then subjected to CMP until an upper surface of the active region 120 is exposed. Then, a selective etching process is performed on the metal layer until the top surface of the metal layer is level with the interface between the second and the third impurity regions 120b, 120c.

The exposed metal layer is further etched using a gate spacer etch-back process to obtain the electrodes 160. Specifically, a dielectric layer is formed over the selectively etched metal layer, and patterned to form a spacer. The metal layer is subjected to the etch-back processing using the spacer thereby forming the gate electrodes 160. At this time, the gate electrodes 160 extend in the second direction cross to the bit lines 130, thereby forming word lines.

Although not shown in the drawings, some of the dielectric layers may remain over the gate electrodes 160 when the gate spacer etch-back process was completed, and act as insulation layers.

Further, the gate electrodes 160 may be formed as a single gate instead of the dual gate. In a single gate configuration, the gate electrode 160 is formed over one sidewall of the second impurity region 120b, rather than two sidewalls. Alternatively, the gate electrode 160 may be formed as a surrounding gate which surrounds the sidewalls of the second impurity region 120b.

Figure 30:
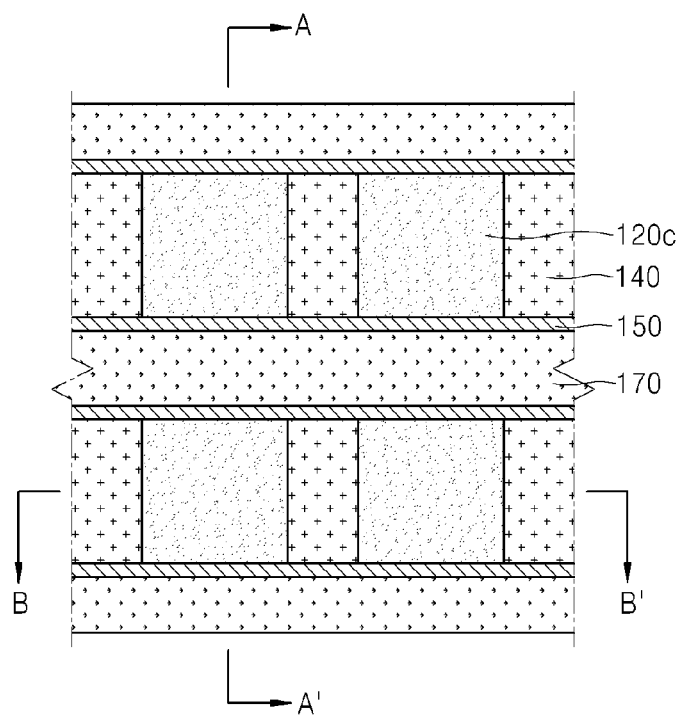
Figure 31:
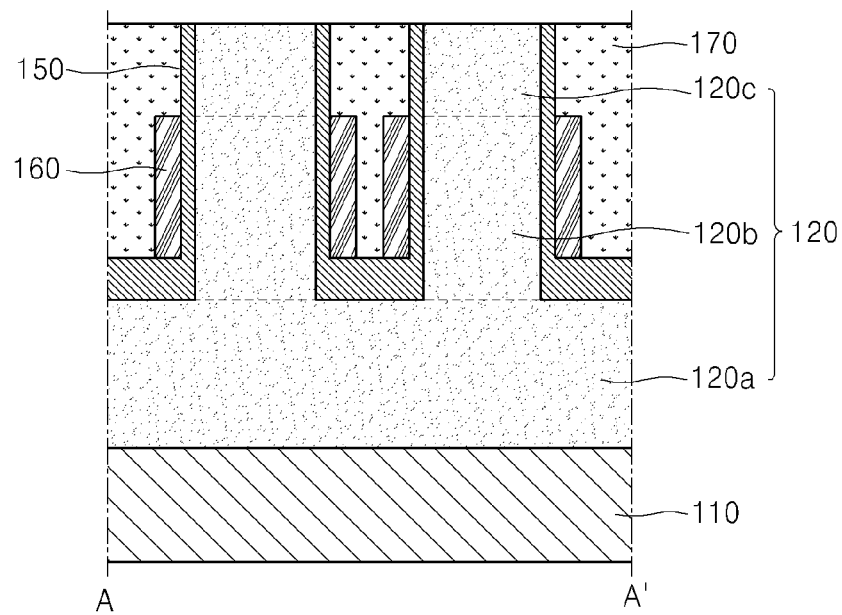
Figure 32:
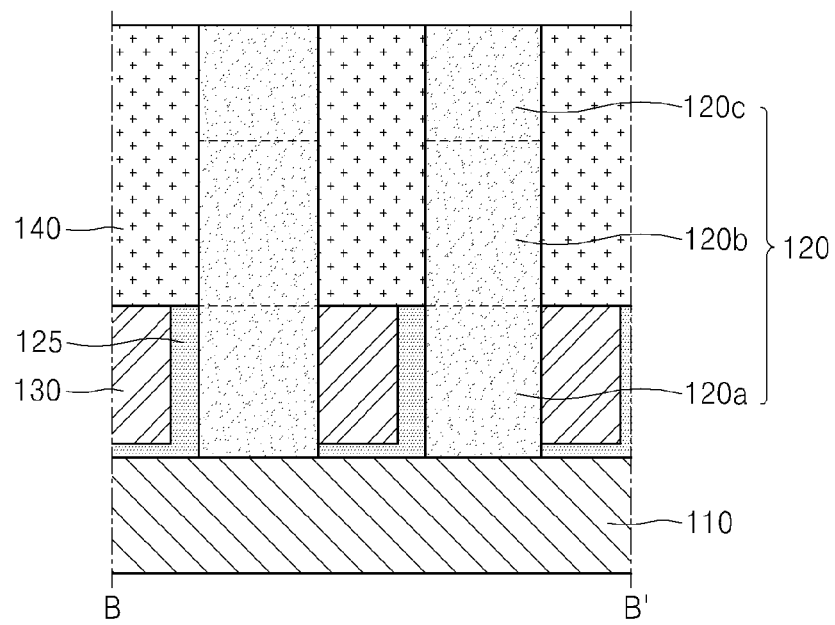

Referring to FIG. 30 to FIG. 32, a third isolation layer 170 is formed between the gate electrodes 160 such that the second trench T2 (see FIG. 25) above the gate electrodes 160 is filled with the third isolation layer 170.

The third isolation layer 170 may be formed by depositing a silicon oxide layer, a silicon nitride layer, a BPSG layer, a PSG layer, a SOG layer, a PSZ layer, an $O_3$-TEOS layer, a HDP oxide layer, an ALD oxide layer or the like via CVD, ALD, or another gap-filling process(see FIG. 25), and then subject to a CMP or etch-back process until the upper surface of the active region 120 is exposed. In this way, the third isolation layer becomes planarization with the upper surface of the active region 120.

As a result, adjacent active pillars 120 are isolated from each other by the first, second, and third isolation layers 125, 140, 170.

Figure 33:
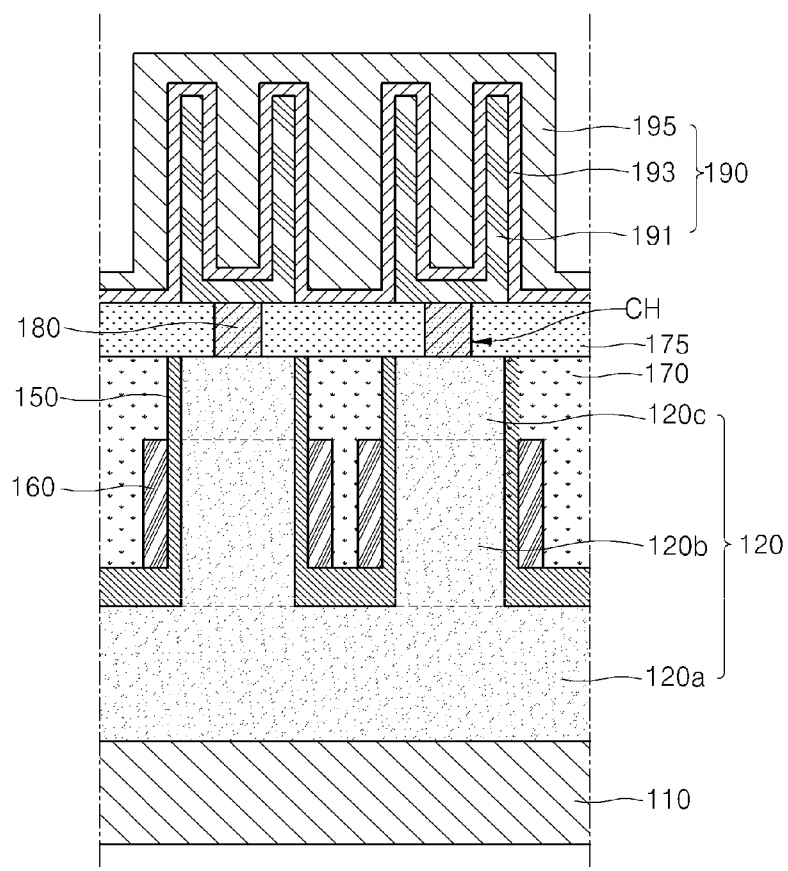
FIG. 33 is a sectional view of the semiconductor device of FIG. 31, which has a storage node contact plug and a capacitor formed in an active region.

FIG. 33 is a sectional view of the semiconductor device of FIG. 31, which has a storage node contact plug and a capacitor formed on the active region.

Referring to FIG. 33, after forming the third isolation layer 170 of FIG. 31, a capacitor 190 is formed to be electrically connected to the third impurity region 120c through a storage node contact plug 180, which fills a contact hole CH in an interlayer insulation layer 175 formed over the active region, thereby forming a DRAM with a $4F^2$ layout.

The capacitor 190 may include a capacitor lower electrode 191, a dielectric layer 193, and a capacitor upper electrode 195. The capacitor 190 has a cylinder structure. Since the interlayer insulation layer 175, the contact hole CH, the storage node contact plug 180, and capacitor 190 may be formed using a process well-known to a person having an ordinary skill in the art, detailed descriptions thereof will be omitted herein.

Meanwhile, although impurity implantation is described as being performed after the bit lines 130 are formed, the impurity implantation may be performed in other ways. For example, in an embodiment described hereinafter, the impurity implantation is performed before the bit lines 130 are formed.

Figure 34:
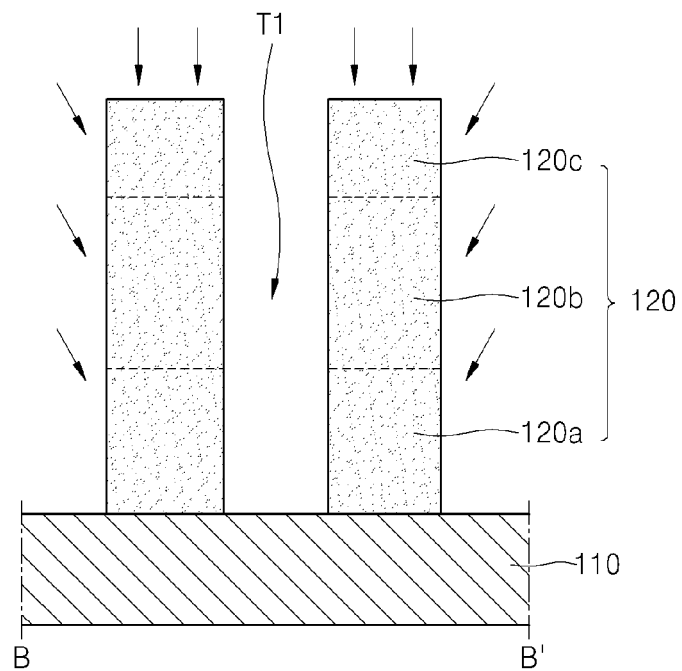
FIGS. 34 and 35 are sectional views of a method of manufacturing a semiconductor device via impurity implantation according to another embodiment of the present invention.
Figure 35:
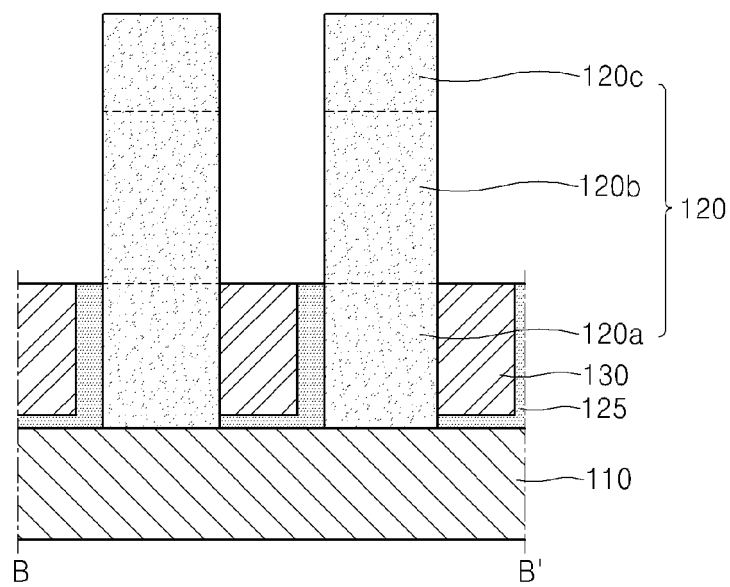

FIGS. 34 and 35 are sectional views of a method of manufacturing a semiconductor device via impurity implantation according to another embodiment.

Referring to FIG. 34, after forming the plurality of pillars P separated from each other by the first trenches Ti of FIG. 14, an impurity is implanted into the pillars P to form active pillars 120, each of which includes first, second, and third impurity regions 120a, 120b, 120c having substantially the same concentration of the impurity of the same polarity from a lower portion to the top of each pillar P.

Herein, although the active pillars 120 are illustrated as including the first to third impurity regions 120a 120b, 120c formed through impurity implantation, the first to third impurity regions 120a, 120b, 120c of the active pillars 120 may be defined by a position of the gate electrode which is formed in a subsequent process.

Impurity implantation conditions for forming the active pillars 120 may be the same as that of the embodiment described above, and thus a detailed description thereon will be omitted.

Referring to FIG. 35, the first isolation layer 125 is formed over a bottom surface of the first trench T1 (see FIG. 14) and a lower sidewall of the first trench T1 (see FIG. 14), and the bit line 130 fills a gap between the first insulation layer 125 and a lower sidewall of the pillar P (see FIG. 14). Since the material and the process for forming the bit line 130 and the first isolation layer 125 may be the same as those of FIG. 15 to FIG. 17, repeated descriptions thereof will be omitted.

In this embodiment, in order to ensure uniform distribution of the implanted impurity within the active region 120, the method may further include annealing at 900 to 1100 Celsius degrees, for example, using a rapid thermal annealing (RTA) process.

As such, when the bit lines 130 are formed after the active pillars 120 are formed through impurity implantation, the method is more advantageous to obtain a more uniform doping profile in the active pillars 120.

Figure 36:
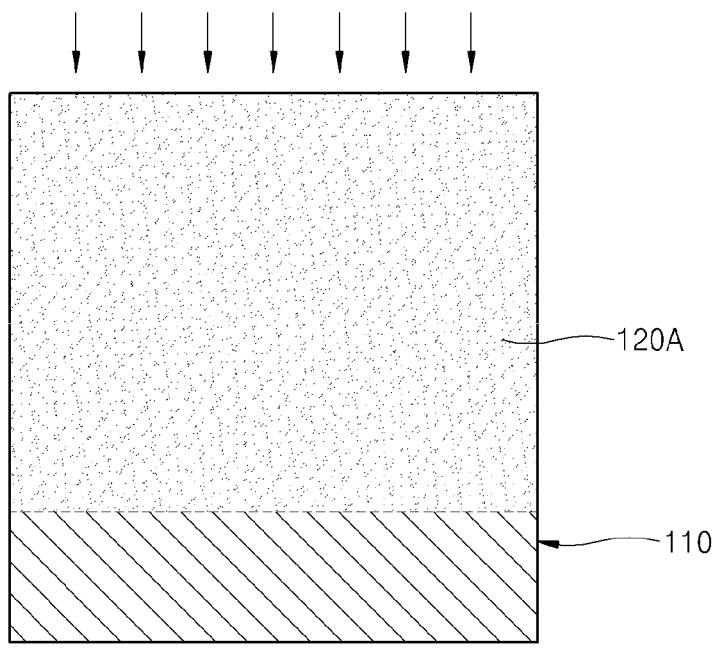
FIGS. 36 and 37 are sectional views of a method of manufacturing a semiconductor device via impurity implantation according to a further embodiment of the present invention.
Figure 37:
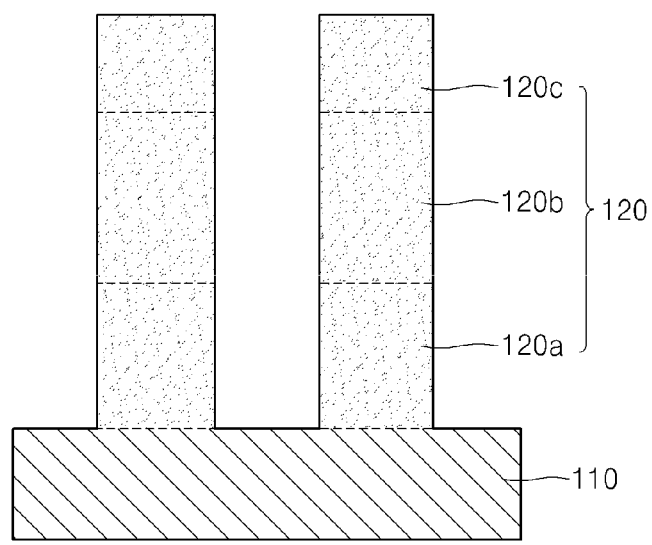

FIGS. 36 and 37 are sectional views of a method of manufacturing a semiconductor device via impurity implantation according to a further embodiment.

Referring to FIG. 36, an impurity is implanted throughout the substrate 110 to a depth corresponding to a bottom of an active pillar. The impurity may be implanted into the substrate by ion implantation. As a result, one region of the substrate 110 is formed with pre-active pillars 120A. Such an impurity implantation process may be carried out by typical ion implantation and a doping concentration of impurity is controlled to be $8 \times 10^{18}$ to $3 \times 10^{19}$ atom/cm$^3$. In addition, such ion implantation may be carried out in combination of multi ion implantation, tilt ion implantation, and orient ion implantation. During the implantation process, the substrate 110 can be rotated or moved in front, rear, right, and left directions.

Referring to FIG. 37, a plurality of active pillars 120 are formed by etching the substrate 110 in a first direction (for example, in a direction cross to the word lines) to form a plurality of trenches using photolithography (see FIG. 36).

Here, each of the active pillars 120 vertically protrudes from the substrate 110 and includes a first impurity region 120a, a second impurity region 120b and a third impurity region 120c, which are sequentially formed from lower portions of the active pillars 120. The first to third impurity regions 120a 120b, 120c of the active pillars 120 may be determined according to positions of gate electrodes, which will be formed in a subsequent process.

Except for formation of the active pillars 120 by etching the substrate after the impurities are implanted throughout the substrate 110, the method according to this embodiment employs the same processes as those of the embodiment described with reference to FIGS. 12 to 32, and thus detailed descriptions thereof will be omitted herein.

As such, when the bit lines 130 are formed after forming the active pillars 120 separated by the trenches by etching the substrate 110, the method advantageously provides, in addition to the advantages obtainable from the embodiment described above, a more uniform doping profile in the active pillars 120.

In addition, although not shown in the drawings, when the bit lines 130 are formed under the first impurity regions 120a as shown in FIG. 11. To form such device shown in FIG. 11, the active pillars 120 each including the first to the third impurity regions 120a, 120b, 120c may be formed by forming a plurality of recesses in the substrate 110. A liner insulation layer 172 is formed over bottom surfaces of the recesses and sidewalls of the recesses. Buried bit lines 130 are formed over the liner insulation layer 172 using a conductive material such as metal, metal silicide, polysilicon, and the like. Ion implantation of the same kind of impurity is performed into semiconductor pillars. Bottom surfaces of the pillars are contacting the bit lines, and upper surfaces and sidewalls of the pillars are exposed to the outside.

The active pillars 120 may be formed by stacking a semiconductor substrate including first to third region layers over the substrate 110 or forming semiconductor growth layers over the substrate 110. Then, impurities of the same polarity are implanted into the respective region layers. Next, the semiconductor substrate 110 is removed from the implanted stack layer or the implanted semiconductor growth layers. Such a method of forming the active pillars 120 may also be applied to the semiconductor devices shown in FIGS. 1 and 7 and the semiconductor device including the surrounding gate. In this case, the process of removing the implanted stack layers or the semiconductor growth layers implanted with the impurity from the substrate 110 may be substituted with a process of patterning the semiconductor substrate or semiconductor growth layers (or implanted stack layers) implanted with the impurity.

Further, in FIG. 11, the bit lines 130 may be formed by ion implantation of impurities into the substrate 110. In this case, the bit lines 130 may be formed by ion implantation of an impurity, which has a different polarity than that of the substrate 110. Alternatively, the bit lines 130 may be formed by forming an insulation layer through implantation of nitrogen into the substrate 110, followed by implanting an impurity into the insulation layer. The other processes for forming gate electrodes or impurity implantation are the same as those described above, and detailed descriptions thereof will be omitted.

Next, voltage-current characteristics of a DRAM and charge and discharge characteristics according to an embodiment of the present invention will be described.

Figure 38:
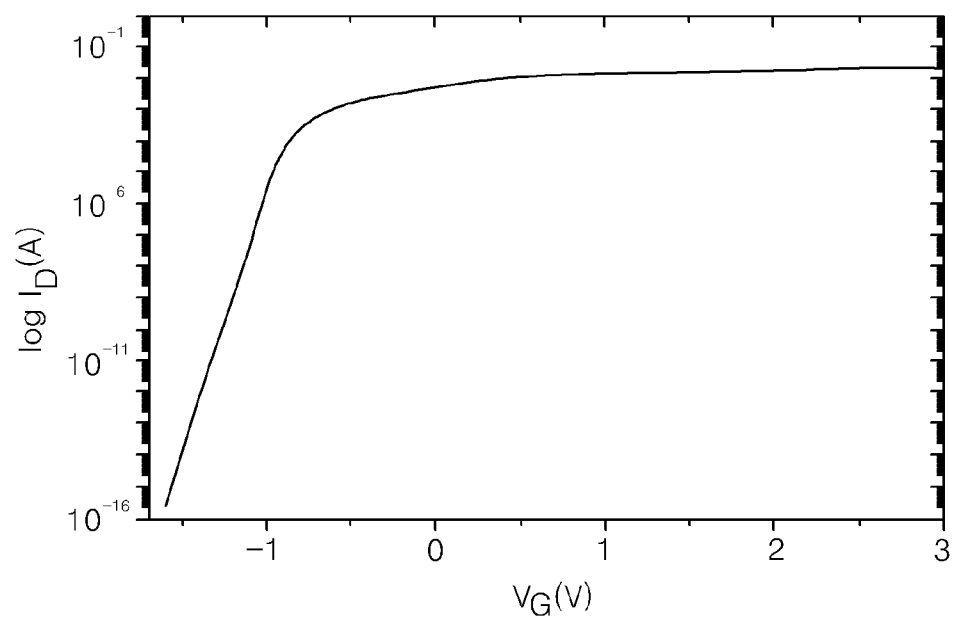
FIG. 38 is a graph depicting voltage-current characteristics of a DRAM according to an embodiment of the present invention.

FIG. 38 shows a simulation result of a drain current with respect to a gate voltage the DRAM according to the first embodiment of the present invention shown in FIG. 1, in which simulation was carried out using a TCAD tool Sentaurus (Synopy Co., Ltd.). The simulation result shown in FIG. 38 was obtained under the following conditions. Impurity doping concentration in the active region 120 was 1×1019 atom/cm3. See FIGS. 1 and 5. The silicon thickness in the active region 120 was 10 nm. See FIGS. 1 and 6. The thickness of the gate insulation layer 150a was 2 nm. See FIGS. 1 and 8. Drain voltage was 1 V. The dual-gate electrodes are each formed of molybdenum (Mo).

As shown in FIG. 38, it could be ascertained that a threshold voltage was −0.2V and there was a sufficient difference between off-current and on-current.

Based upon this result, it could be ascertained that the junctionless vertical gate transistor may work as a DRAM cell since the junctionless vertical gate transistor shows similar on/off characteristics to those of a conventional transistor in which source and drain regions are implanted with different kind of impurities from that of a body region.

Figure 39:
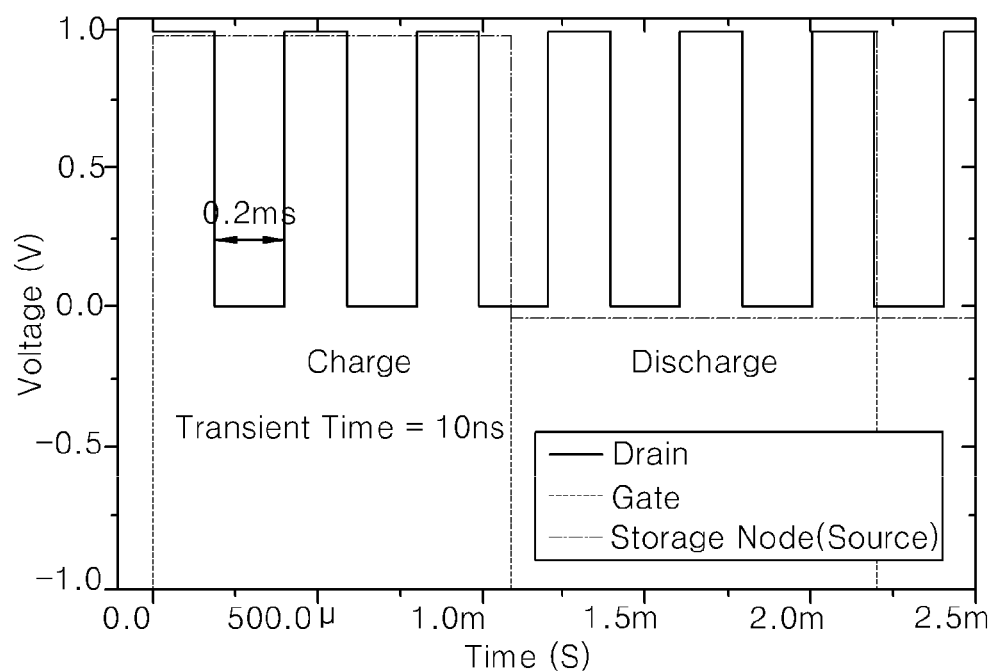
FIG. 39 is a graph depicting charge and discharge characteristics of a DRAM according to an embodiment of the present invention.

A simulation result of charge and discharge characteristics of the DRAM according to the first embodiment of the present invention is shown in FIG. 39. The simulation was carried out using a TCAD tool Sentaurus (Synopy Co., Ltd.) and transient time was 10 ns. The simulation result was obtained under the same condition as employed for the simulation shown in FIG. 38. As shown in FIG. 39, it could be ascertained that electric charges were stored (charged) and discharged in a capacitor connected to the source of the DRAM according to the first embodiment of the present invention.

Figure 40:
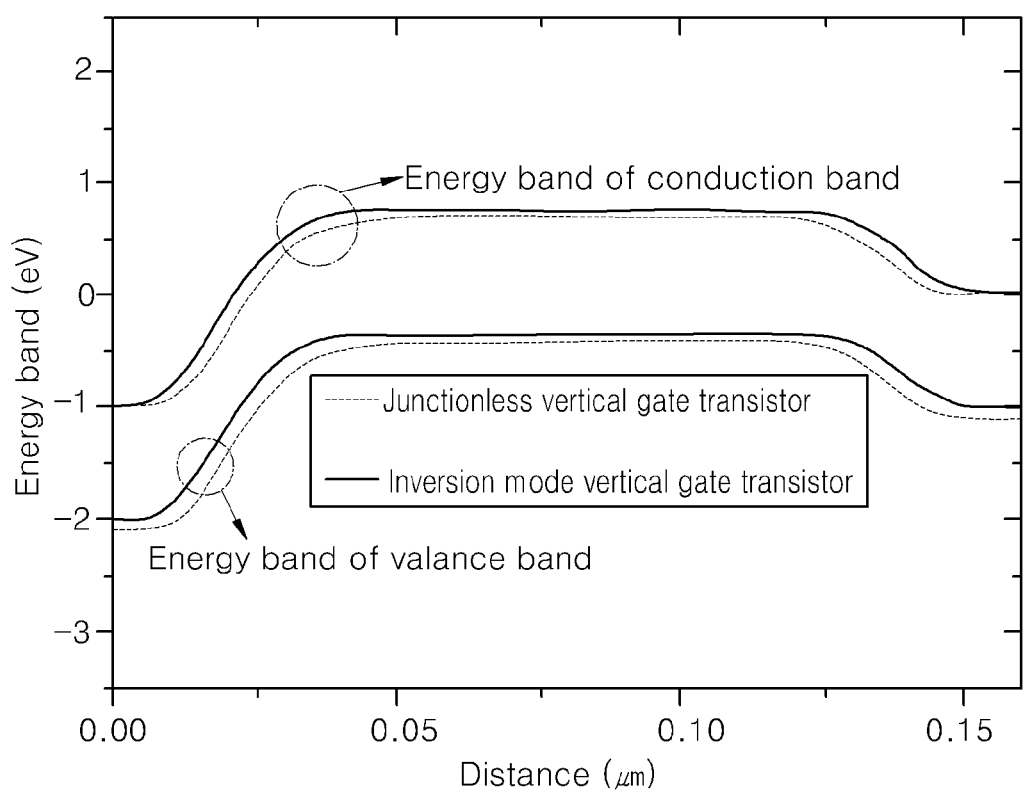
FIG. 40 is a graph depicting (i) an energy band of a DRAM according to an embodiment of the present invention and (ii) an energy band of a conventional DRAM including source/drain regions formed through implantation using heterogeneous impurities.

FIG. 40 is a graph depicting (i) an energy band of a DRAM according to the first embodiment of the present invention and (ii) that of a conventional DRAM including source/drain regions which are formed through implantation of impurities different from the impurities in a body region. The conventional DRAM includes an inversion mode vertical gate transistor. These simulation results were obtained under the same condition as employed for the simulation shown in FIG. 38.

Referring to FIG. 40, it can be ascertained that the source, the body, and the drain regions of the DRAM have lower energy barriers than source, body, and drain regions of the conventional DRAM, respectively.

As a result, it can be ascertained that the DRAM including the junctionless vertical gate transistor according to an embodiment of the present invention has improved current leakage characteristics compared with a conventional DRAM including a junction vertical gate transistor.

Although some embodiments have been described herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

What is claimed is:

1. A semiconductor device comprising:
a plurality of active pillars, each of the active pillars including a first impurity region disposed over a surface of a substrate, a plurality of second impurity regions disposed over the first impurity region, and a plurality of third impurity regions disposed over the plurality of second impurity regions, respectively, wherein the plurality of second impurity regions is arranged at a constant interval over the first impurity region;
a gate electrode extending across each of the plurality of active pillars along a row of second impurity regions and disposed over sidewalls of the second impurity regions in the row, wherein the sidewalls of the second impurity regions in the row are each disposed between second impurity regions that are adjacent in a corresponding active pillar of the active pillars; and
a bit line disposed between adjacent first impurity regions, disposed under the gate electrode, crossing the gate electrode, and being in contact with one of the adjacent first impurity regions,
wherein the first, second, and third impurity regions comprise impurities of the same polarity.

2. The semiconductor device according to claim 1, wherein each of the first, second, and third impurity regions has an impurity concentration ranging from 8×10E18 to 3×10E19 atom/cm3.

3. The semiconductor device according to claim 1, wherein the first, second, and third impurity regions have substantially the same impurity concentration.

4. The semiconductor device according to claim 1, wherein the first impurity region is a drain region, the second impurity region is a body or channel region, and the third impurity region is a source region.

5. The semiconductor device according to claim 1, wherein the gate electrode covers one or more sidewalls of each second impurity region.

6. The semiconductor device according to claim 1, wherein the bit line is in contact with a sidewall of the first impurity region and is disposed over the substrate.

7. The semiconductor device according to claim 1, wherein the substrate is a silicon (Si) substrate, and the active pillar comprises an N-type impurity.

8. The semiconductor device according to claim 1, wherein the substrate is any of a Si—Ge substrate, a Ge substrate, a III-V group compound semiconductor substrate and a combination thereof, and the active pillar comprises a P-type impurity.

9. The semiconductor device according to claim 1, wherein the substrate has a nano structure, and
wherein the nano structure includes any of a nano wire structure, a nano ribbon structure, and a combination thereof.

10. The semiconductor device according to claim 1, further comprising:
a gate insulation layer,
wherein the gate insulation layer comprises:
a first insulation section disposed between the gate electrode and the sidewalls of the second impurity regions in the row, and
a second insulation section in contact with a bottom surface of the first insulation section and including a first portion and a second portion, the first portion being disposed between the gate electrode and the first impurity regions of the active pillars and the second portion being disposed between the first insulation section and the first impurity regions of the active pillars,
wherein the second insulation section is thicker than the first insulation section.

11. The semiconductor device according to claim 1, wherein the first impurity region, the second impurity regions, and the third impurity regions are sequentially stacked over the substrate, and a stacking direction of the first impurity region, the second impurity regions, and the third impurity regions is perpendicular to the surface of the substrate.

12. A method of manufacturing a semiconductor device, the method comprising:
forming a plurality of active pillars, each of the active pillars including a first impurity region formed over a surface of a substrate, a plurality of second impurity regions formed over the first impurity region, and a plurality of third impurity regions formed over the second impurity regions, respectively, wherein the plurality of second impurity regions is arranged at a constant interval over the first impurity region;
forming a plurality of bit lines, each bit line being formed between two adjacent first impurity regions and over the substrate to be insulated from the substrate, said each bit line contacting a first sidewall of one of the two adjacent first impurity regions; and
forming a plurality of gate electrodes, each gate electrode extending across the plurality of active pillars along a row of second impurity regions so that the gate electrode is formed over sidewalls of the second impurity regions in the row, wherein each of the sidewalls of the second impurity regions in the row is disposed between two second impurity regions that are adjacent in a corresponding active pillar of the active pillars,
wherein the first, second, and third impurity regions comprise impurities of the same polarity.

13. The method according to claim 12, wherein forming the plurality of gate electrodes comprises:
   forming an insulation layer over the bit lines;
   patterning the insulation layer so that a plurality of trenches is formed between second and third impurity regions of adjacent active pillars, each of the trenches crossing over the bit lines and partially exposing top surfaces of the bit lines and top surfaces of the first impurity regions of the active pillars;
   forming a gate insulation layer including a first portion and a second portion, the first portion being disposed over the exposed top surfaces of the bit lines and the first impurity regions and the second portion being disposed over a sidewall of each of the trenches; and
   forming each of the gate electrodes with a conductive material over the gate insulation layer to be disposed over the sidewalls of the second impurity regions in the row.

14. The method according to claim 12, wherein forming the plurality of active pillars comprises:
   activating the first impurity region; and
   activating the second impurity regions and the third impurity regions,
   wherein the first, second, and third impurity regions are activated using an in-situ process.

15. The method according to claim 12, wherein forming the plurality of active pillars comprises:
   forming a semiconductor growth layer including first, second, and third region layers over the substrate;
   implanting impurities with the same polarity into the first, second, and third region layers of the semiconductor growth layer; and
   patterning the impurity-implanted semiconductor growth layer to form the plurality of active pillars.

16. The method according to claim 15, wherein the plurality of active pillars is formed by using any of multi ion implantation, tilted ion implantation, and oriented ion implantation.

17. The method according to claim 12, wherein forming the plurality of bit lines comprises:
   forming an insulation layer over a second sidewall of each of the first impurity regions and over the substrate between adjacent active pillars; and
   forming a conductive material layer over the insulation layer to obtain each of the bit lines.

18. The method according to claim 12, wherein the first impurity region, the second impurity regions, and the third impurity regions are sequentially stacked over the substrate, and a stacking direction of the first impurity region, the second impurity regions, and the third impurity regions is perpendicular to the surface of the substrate.

* * * * *